(12) United States Patent
Craven-Bartle et al.

(10) Patent No.: US 7,868,878 B2
(45) Date of Patent: Jan. 11, 2011

(54) OPTICAL SYSTEM, AN ANALYSIS SYSTEM AND A MODULAR UNIT FOR AN ELECTRONIC PEN

(75) Inventors: Thomas Craven-Bartle, Lund (SE); Ola Wassvik, Lund (SE); Peter Gredinger, Skurup (SE); Ola Strömberg, Staffanstorp (SE)

(73) Assignee: Anoto AB, Lund (SE)

( * ) Notice: Subject to any disclaimer, the term of this patent is extended or adjusted under 35 U.S.C. 154(b) by 633 days.

(21) Appl. No.: 10/582,780

(22) PCT Filed: Dec. 15, 2004

(86) PCT No.: PCT/SE2004/001864

§ 371 (c)(1),
(2), (4) Date: Jun. 13, 2006

(87) PCT Pub. No.: WO2005/057471

PCT Pub. Date: Jun. 23, 2005

(65) Prior Publication Data

US 2007/0114367 A1    May 24, 2007

Related U.S. Application Data

(60) Provisional application No. 60/529,118, filed on Dec. 15, 2003, provisional application No. 60/586,083, filed on Jul. 8, 2004.

(30) Foreign Application Priority Data

Dec. 15, 2003  (SE) ..................... 0303351
Jul. 8, 2004   (SE) ..................... 0401802

(51) Int. Cl.
*G06F 3/033* (2006.01)

(52) U.S. Cl. .................................... 345/179

(58) Field of Classification Search .................. 345/179
See application file for complete search history.

(56) References Cited

U.S. PATENT DOCUMENTS 3,649,939 A * 3/1972 Hildebrandt .................. 336/65

(Continued)

FOREIGN PATENT DOCUMENTS

EP        0 023245        2/1981

(Continued)

OTHER PUBLICATIONS

Japanese Application for Utility Model Registration No. 03-012000, Feb. 13, 1991 (18 pages).

(Continued)

*Primary Examiner*—Quan-Zhen Wang
*Assistant Examiner*—Robert R Rainey
(74) *Attorney, Agent, or Firm*—Finnegan, Henderson, Farabow, Garrett & Dunner LLP

(57) ABSTRACT

A modular unit is designed for an electronic pen. The modular unit comprises a carrier (70) with a receiver for a writing implement, a printed circuit board (72), a two-dimensional radiation sensor (78) mounted on the printed circuit board, and an imaging unit (82) which defines an image plane. The carrier (70), the printed circuit board (72), and the imaging unit (82) are joined together with the imaging unit (82) facing the radiation sensor (78) to locate the image plane at the radiation sensor (78). The modular unit may comprise an analysis system dedicated to a particular optical analysis application, such as position determination based on images of a position-coding pattern. A radiation source, such as an LED or a laser diode, may be arranged on the printed circuit board or mounted in a holder on the imaging unit. The imaging unit (82) may be implemented as a boresight unit for controlling the spatial origin of radiation transmitted towards the radiation sensor (78). The boresight unit may comprise a radiation-transmitting channel, an imaging lens, and a redirecting mirror in the channel.

35 Claims, 8 Drawing Sheets

U.S. PATENT DOCUMENTS

| | | | |
|---|---|---|---|
| 3,735,142 A * | 5/1973 | Harr et al. | 235/462.45 |
| 4,475,240 A | 10/1984 | Brogardh et al. | |
| 4,962,364 A * | 10/1990 | Okuya et al. | 338/119 |
| 5,477,012 A | 12/1995 | Sekendur | |
| 5,774,602 A | 6/1998 | Taguchi et al. | |
| 5,852,434 A | 12/1998 | Sekendur | |
| 5,870,636 A | 2/1999 | Sugita et al. | |
| 5,939,702 A | 8/1999 | Knighton et al. | |
| 6,330,976 B1 | 12/2001 | Dymetman et al. | |
| 6,454,482 B1 | 9/2002 | Silverbrook et al. | |
| 6,570,104 B1 | 5/2003 | Ericson et al. | |
| 6,667,695 B2 | 12/2003 | Pettersson et al. | |
| 6,674,427 B1 | 1/2004 | Pettersson et al. | |
| 6,732,927 B2 | 5/2004 | Olsson et al. | |
| 6,751,410 B1 | 6/2004 | Stavely | |
| 7,006,134 B1 | 2/2006 | Arai et al. | |
| 7,098,894 B2 * | 8/2006 | Yang et al. | 345/166 |
| 2001/0038349 A1 | 11/2001 | Hugosson et al. | |
| 2002/0044138 A1 | 4/2002 | Edso et al. | |
| 2002/0048404 A1 | 4/2002 | Fahraeus et al. | |
| 2002/0148655 A1 | 10/2002 | Cho et al. | |
| 2002/0163511 A1 * | 11/2002 | Sekendur | 345/179 |
| 2002/0175903 A1 | 11/2002 | Fahraeus et al. | |
| 2003/0034961 A1 * | 2/2003 | Kao | 345/179 |
| 2003/0053699 A1 | 3/2003 | Olsson | |
| 2003/0066896 A1 | 4/2003 | Pettersson et al. | |
| 2003/0118233 A1 | 6/2003 | Olsson | |
| 2003/0122855 A1 | 7/2003 | Pattersson | |
| 2003/0128194 A1 | 7/2003 | Pettersson | |

FOREIGN PATENT DOCUMENTS

| | | |
|---|---|---|
| EP | 0 407 734 A1 | 1/1991 |
| EP | 0407734 | 1/1991 |
| EP | 1 304 872 A1 | 4/2003 |
| JP | 56-021227 | 2/1981 |
| JP | 479176 | 3/1992 |
| JP | 06-309084 | 11/1994 |
| JP | 7082510 | 3/1995 |
| JP | 7208980 | 8/1995 |
| JP | 10-082948 | 3/1998 |
| JP | 11-110469 | 4/1999 |
| JP | 11-272852 | 10/1999 |
| JP | 2000-293617 | 10/2000 |
| JP | 2002-197411 | 7/2002 |
| WO | WO 01/30590 A1 | 5/2001 |
| WO | WO 02/34549 | 5/2002 |
| WO | WO 02/34549 A1 | 5/2002 |
| WO | WO 02/48853 A1 | 6/2002 |
| WO | WO 03/001358 | 1/2003 |
| WO | WO03/001358 A1 * | 1/2003 |
| WO | WO-03/025658 A1 | 3/2003 |
| WO | WO-03/069547 A1 | 8/2003 |
| WO | WO-2004/097723 A1 | 11/2004 |

OTHER PUBLICATIONS

Japanese Office Action in Application No. 2006-543779, dated Dec. 22, 2009 (20 pages).

European Search Report in Application No. 08103020.7, dated Jul. 15, 2008 (7 pages).

Office Action in Chinese Application No. 200480040388.2, dated Sep. 7, 2007 (6 pages).

Office Action from the European Patent Office in Application No. 04 820 337.6, dated Nov. 29, 2007 (6 pages).

Chinese Notification of the First Office Action dated Oct. 30, 2009 in Application No. 200810002663.1, 5 pgs.

* cited by examiner

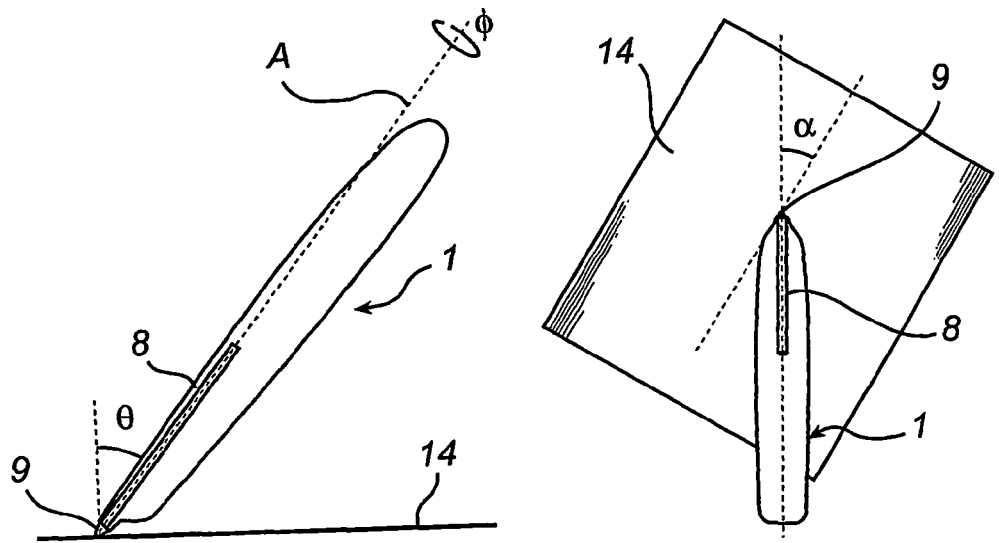
Fig. 1a  Fig. 1b
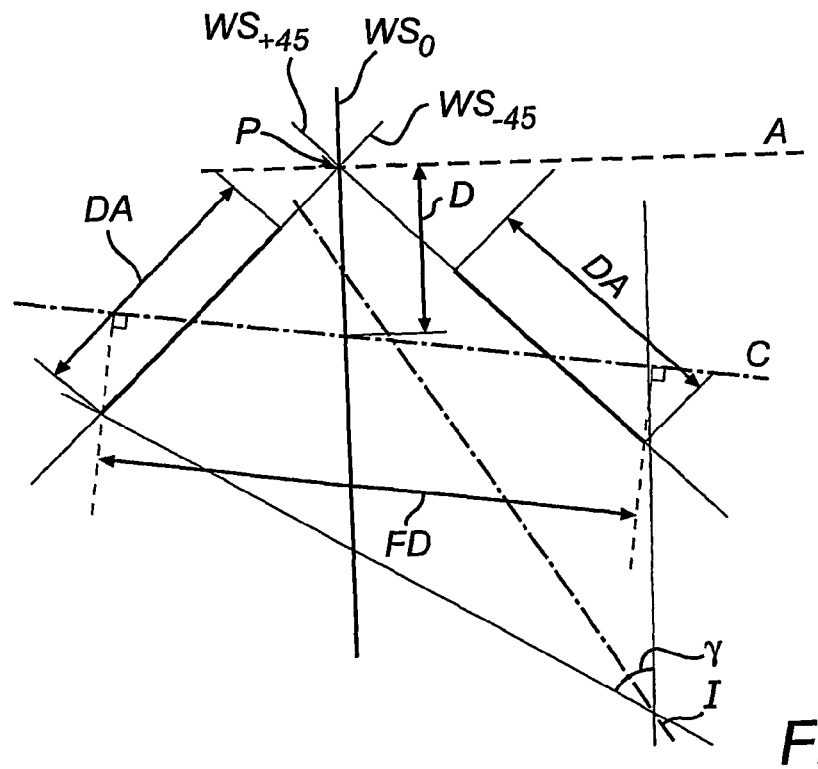
Fig. 2

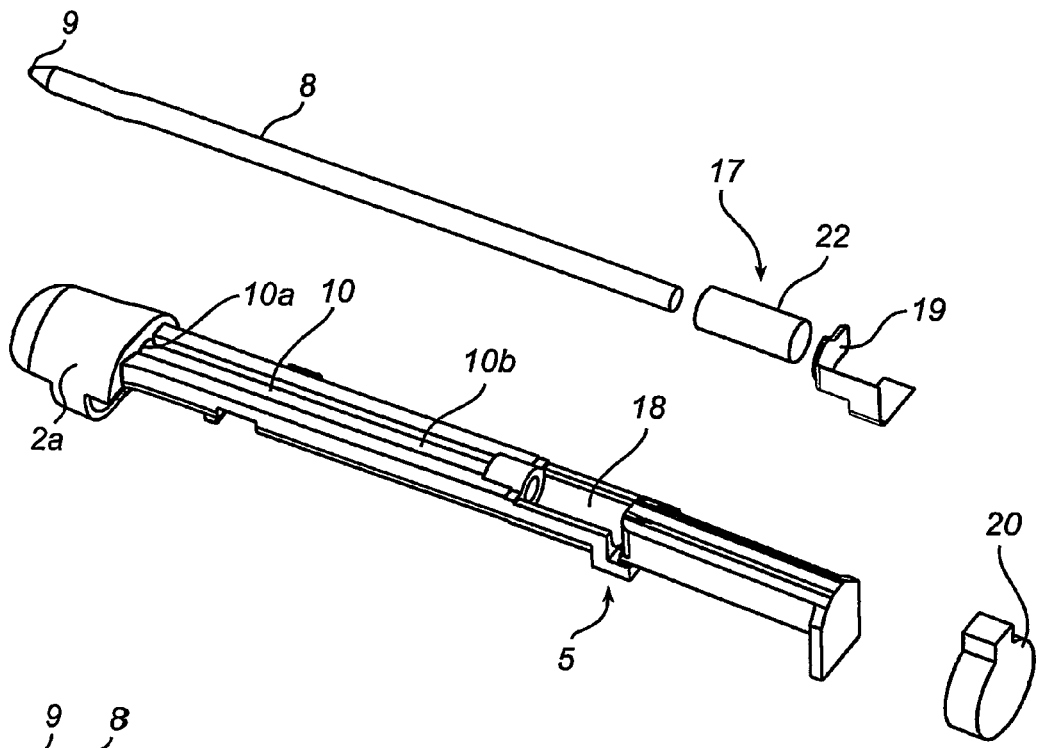
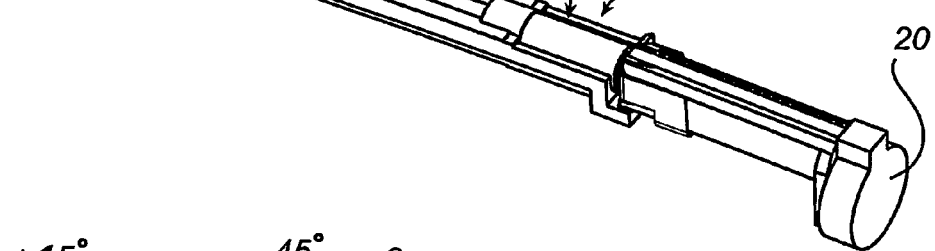
Fig. 5
Fig. 6
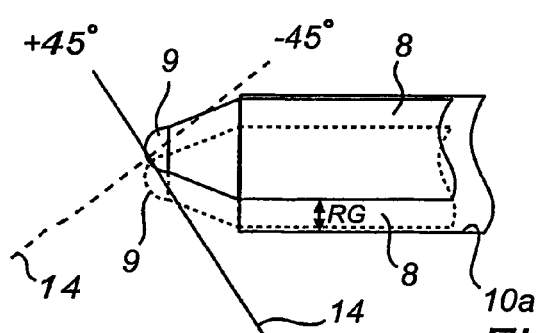
Fig. 7

OPTICAL SYSTEM, AN ANALYSIS SYSTEM AND A MODULAR UNIT FOR AN ELECTRONIC PEN

CROSS-REFERENCE TO RELATED APPLICATIONS

The present application claims the benefit of Swedish patent application No. 0303351-1 and U.S. provisional patent application No. 60/529,118, both filed on Dec. 15, 2003, as well as Swedish patent application No. 0401802-4 and U.S. provisional patent application No. 60/586,083, both filed on Jul. 8, 2004, which all are hereby incorporated by reference.

FIELD OF THE INVENTION

The present invention relates to an optical system, which is arranged to irradiate an object and to transmit an image of the object to an image plane. The invention also relates to an analysis system including such an optical system, and to a modular unit for an electronic pen.

BACKGROUND ART

In the ever increasing demands on mobility of society of today, it is popular to provide small and portable devices having imaging capability. The optical systems of the above type are thus implemented in handheld imaging devices, such as handheld scanners and electronic pens. In order to restrict the overall size of such a handheld device, it is desirable to make the optical system compact.

The optical system typically comprises an irradiating system including a radiation source for providing the irradiation of the object, and an imaging system including a two-dimensional radiation sensor for recording an image of the object. For handheld devices, the spatial orientation between the optical system and the object, which typically is a plane surface, such as a paper, may vary substantially. For example, during the process of writing with an electronic pen, the pen will frequently be held at varying angles to the paper. Thus, the spatial orientation of the paper also varies in relation to the radiation sensor and the radiation source. As the angle varies, the relation between the radiation sensor and the writing surface will be changed. This sets demands on an imaging system to adequately image the viewed part of the object for different angles between the pen and the paper.

Further, demands are set on the radiation source to irradiate the object properly. These demands are accentuated when the radiation source and the radiation sensor are arranged at positions that relate to the object in different ways, such as being arranged at different distances to the object and forming different angles to the object. In these cases, the radiation source needs to emit radiation in a sufficiently large solid angle in order to ensure that the viewed object area is irradiated irrespective of orientation changes between the handheld device and the object.

WO 03/001358 discloses an electronic pen, in which a camera unit, a light source and a writing implement are carried by a common mounting part which is arranged at the front end of the pen. This design aims at controlling the mutual location of relevant components in the pen. However, the assembly of this electronic pen is not entirely satisfactory. Further, the electronic pen still involves relatively long tolerance chains between the components of the camera unit and the light source, as well as an electrical coupling between the camera unit and a printed circuit board that may increase the manufacturing cost, decrease the durability of the pen, and introduce manual assembly steps in the production.

WO 03/025658 discloses an optical component which is designed to enable an irradiating system and an imaging system to share optical axis. Thus, irrespective of its orientation in relation to the object, the radiation source will irradiate the area of the object being imaged by the radiation sensor.

U.S. Pat. No. 5,939,702 discloses an optical reader, in which an emitter and a photodiode are mounted on a circuit board and a light pipe is used for communicating light between an external device, such as a paper having optical data, and the emitter and the photodiode. This optical reader forms merely a pointing means and provides no possibility of optical detection while using a writing functionality. Further, the optical reader is only capable of point detection and requires the reader to be moved for obtaining one- or two-dimensional data. Moreover, the emitter and the photodiode uses the same light pipe, which may cause the photodiode to detect light that comes directly from the emitter and has not interacted with the external device.

SUMMARY OF INVENTION

It is a general object of the invention to provide an enhanced optical system.

It is a specific object of the invention to provide an optical system that is able to image an irradiated object with tolerance to varying orientations and distances between the optical system and the object. It is a further object of the invention to provide an optical system that may be implemented in a compact form. It is also an object of the invention to at least partly relieve or solve the above-mentioned problems.

These and other objects of the invention that will appear from the following description are fully or at least partly achieved by an optical system, an analysis system, modular units, a sensor boresight unit, an optical component, and an electronic pen arrangement. Embodiments of the invention are defined in the dependent claims.

According to one aspect of the invention, it relates to an optical system, which comprises an irradiating system which has an optical axis within said irradiating system and includes a radiation source, and an imaging system which has an optical axis within said imaging system and includes a two-dimensional radiation sensor, said imaging system being arranged to provide an image of an object being irradiated by said irradiating system, wherein said radiation source and said two-dimensional radiation sensor are mounted on a common substrate, and wherein said optical axis of the irradiating system and said optical axis of the imaging system are non-coinciding within said systems.

This aspect provides for an optical system with a well-defined spatial relationship between the radiation source and the two-dimensional radiation sensor. This enables a short tolerance chain for defining the possible variation of the relationship between the irradiated area and imaged area on the object. Thereby, requirements on design tolerances and/or assembly tolerances may be relaxed, whereby the yield in serial production may be increased. Alternatively, the required solid angle to be irradiated may be reduced or the variation in orientation allowed in use between a device incorporating the optical system and the object may be increased. This is possible, since the variation due to tolerances in the relationship between the irradiated area and the imaged area is reduced. Reducing the solid angle implies that the power fed to the radiation source may be reduced, whereby battery lifetime may be increased.

The radiation source and the radiation sensor being mounted on a common substrate may be implemented by mounting the radiation source and the radiation sensor on a common printed circuit board (PCB). This enables cheap and simple connection of the source and the sensor to electronics for controlling their function and analysing the acquired image information.

An optical axis of a system forms a symmetry line for propagation of radiation in relation to the system. The optical axis extends within and between components of the system, and further extends beyond the components of the system to one or more objects imaged or irradiated by the system. In the context of the present application, the terms "optical axis within the irradiating system" and "optical axis within the imaging system" implies the optical axis as defined only within the components of the respective systems. Thus, these terms do not include the optical axis outside and beyond the components of the respective systems. Further, the definition that the optical axes are "non-coinciding within said systems" implies that the optical axes do not overlap or cross each other at any point within the systems.

The provision of non-coinciding optical axes of the irradiating system and the imaging system within the systems provides a possibility to optimize irradiating optics and imaging optics to their respective purpose. Further, the risk of leakage of radiation directly from the radiation source to the radiation sensor may be reduced.

As mentioned above, depending on the orientation between a device incorporating the optical system and the object, different areas of the object will be imaged. At a certain orientation between the device and the object, a planar object may be arranged at the object plane of the imaging system. However, when the orientation is changed, the planar object will not lie in the object plane of the imaging system. The imaging system may still image the planar object by a depth of field of the imaging system allowing deviations from the object plane.

The irradiating system may be arranged to redirect radiation from the radiation source, and the imaging system may be arranged to redirect radiation from the irradiated object towards the radiation sensor. This implies that the radiation source and the radiation sensor may be arranged on a substrate that extends in a direction substantially along a longitudinal axis of an elongate device, wherein the area to be imaged and irradiated is at a short end of the device. Such a device may be an electronic pen or a bar code reader. Thus, this arrangement may be suitable if the radiation source and the radiation sensor are to be mounted on e.g. a common PCB in an electronic pen.

The optical axis within the irradiating system and the optical axis within the imaging system may run essentially in parallel to each other. This ensures that the optical axes will be non-coinciding within the systems. Further, optical components of the irradiating system and optical components of the imaging system may be arranged without interfering with each other.

The optical axis within the irradiating system and the optical axis within the imaging system may further run essentially parallel to the common substrate. Thus, the substrate will not interfere with the optical path of the irradiating and imaging systems.

Moreover, the optical axis within the irradiating system and the optical axis within the imaging system may define a plane which is essentially parallel to and at a distance from the common substrate. In one such arrangement, the optical axes of the irradiating and imaging systems are arranged side by side over the common substrate. Thereby, the height of the irradiating system and the imaging system over the common substrate may be minimized, and the diameter of an electronic pen including the optical system may be kept small.

The irradiating system may further comprise a radiation guide for guiding radiation from the radiation source towards the object. The radiation guide may guide the direction of emitted radiation from the radiation source in order to direct it correctly towards the object. Further, there is a control of the emitted radiation, reducing the spreading of stray radiation. The radiation guide may comprise a mirror above the common substrate over the radiation source to provide the redirection of radiation from the radiation source.

The radiation guide may comprise metallized non-exit surfaces. Thus, surfaces of the radiation guide not intended for output of radiation may be metallized to prevent leakage of radiation. This further enhances control of stray radiation from the radiation source and enhances control of the distribution of the emitted radiation.

It should be noted that, as used herein, "stray radiation" implies either radiation that does not give the radiation sensor information on the imaged area, since it may not originate in this area, or radiation which has passed or leaked directly from the radiation source to the radiation detector without having interacted with the object to be imaged.

Further, the radiation guide may present an inclined radiation-redirecting exit surface. This implies that a normal axis of the exit surface is inclined to the optical axis within the irradiating system. This provides a redirection of the radiation emitted from the radiation source towards the object. Thus, the exit surface may be inclined so as to direct the emitted radiation to create an irradiated area that better corresponds to an imaged area at the object.

The radiation guide may also be mounted on the common substrate. This distinctly defines the position of the radiation guide of the irradiating system in relation to the radiation source, whereby the tolerance chain of the irradiating system is kept short. The tolerance of the irradiating system defines a deviation from a nominal position of the irradiated area on the object. Thus, keeping the tolerance chain short may result in a better control of the irradiated area on the object.

The imaging system may further include a sensor boresight unit for controlling a spatial origin of radiation transmitted towards the radiation sensor. The sensor boresight unit thus controls the area viewed by the sensor. It will therefore define the boresight of the sensor. The sensor boresight unit of the imaging system may be a separate unit from the radiation guide of the irradiating system. The sensor boresight unit also provides control of stray radiation, preventing it from being detected by the radiation sensor.

The sensor boresight unit may also be attached to the common substrate. This defines the position of the sensor boresight unit of the imaging system in relation to the radiation sensor, whereby the tolerance chain of the imaging system is kept short. The opto-mechanical tolerances of the imaging system define a deviation from a nominal position of the imaged area on the object. Thus, keeping the tolerance chain short may result in a better control of the imaged area on the object.

Further, where the sensor boresight unit and the radiation guide are both mounted on the common substrate, the spatial interrelationship of these parts may also be well-defined, whereby a short tolerance chain is obtained for the relationship between the imaging and irradiating systems. This implies that the relationship between the imaged and irradiated areas on the object may be adequately controlled.

The sensor boresight unit may comprise a mirror for redirecting radiation from the object towards the radiation sensor.

The mirror is suitably arranged over the substrate on which the radiation sensor is mounted and above the radiation sensor to reflect radiation from the object directly onto the radiation sensor.

The sensor boresight unit may further comprise a lens for creating an image of adequate image quality on the radiation sensor. The lens provides focus of the object plane onto the radiation sensor. The depth of field of the imaging system is suitably arranged to view an object placed in or near the object plane such that a sufficient image quality may be obtained for allowed changes to the optical set-up causing the object to move away from the object plane.

The sensor boresight unit may comprise an optical component, which is arranged to transmit radiation towards the radiation sensor, wherein the optical component comprises a mirror for redirecting radiation from the object towards the radiation sensor, and a lens for creating an image of adequate image quality on the radiation sensor. In this way, the sensor boresight unit comprises few components, whereby tolerance chains of the production of the optical system are shortened. This implies that the allowed variation in the relationship between the irradiated area and the imaged area due to assembly tolerances is reduced. As mentioned above, reduced tolerance chains imply that the irradiated area may be reduced and, thus, that the power fed to the radiation source may be reduced. This also gives fewer problems with stray radiation since the emitted power is reduced.

The sensor boresight unit may further comprise an aperture stop, which may be arranged in front of the optical component. The aperture stop may be used for adjusting the depth of field of the imaging system. Decreasing the size of an opening of the aperture stop will increase the depth of field of the imaging system.

The optical component presents outer surfaces at least part of which may be covered with a material arranged to reduce internal reflections in said outer surfaces. The cover material may have optical properties adapted to provide that the majority of radiation impinging the cover material from the inside of the optical component will not be reflected back into the optical component. Thus, the cover material may have a refractive index that is matched to the refractive index of the material of the optical component, whereby radiation incident on the cover material will be transmitted into the cover material. Additionally or alternatively, the cover material may provide for absorption of radiation that impinges the walls from the inside of the component. This reduces stray radiation caused by internal reflections or scattering in the optical component. The cover material has suitably a large absorption coefficient for radiation wavelengths acquired by the sensor. Further, the cover material may also be selected to prevent radiation from entering the optical component through the cover material. For instance, this may be achieved by the cover material absorbing or reflecting the radiation impinging it from outside the optical component. This would provide an effective block for radiation incident upon the optical component through other surfaces than an entrance surface.

The optical component may be implemented as a solid optics component formed by a unitary body. The solid optics component may be formed of a plastic material, such as polymethylmethacrylate (PMMA), polycarbonate (PC), Zeonex®, polystyrene, nylon, or polysulfone.

The sensor boresight unit may alternatively comprise a housing, providing an internal channel, which is arranged to transmit radiation towards the radiation sensor, wherein a mirror for redirecting radiation from the object towards the radiation sensor and a lens for creating an image of adequate image quality on the radiation sensor are mounted in the housing. This implementation of the lens and the mirror implies that the imaging optics is constituted of separate conventional components, whereby manufacture and quality control is easily implemented. Further, the housing may be structured to be suited for attachment to the common substrate.

The sensor boresight unit may further comprise an aperture stop arranged in the housing. The aperture stop may be formed as a part of inside surfaces of the housing. In this way, the housing may hold all components of the imaging system controlling the radiation path towards the radiation sensor.

The housing presents inside surfaces at least part of which may be arranged to reduce specular reflection of radiation. The inside surfaces may comprise a material which absorbs radiation, and specifically absorbs radiation wavelengths that are acquired by the sensor. The inside surfaces of the housing may also or alternatively be rough or have an appropriate texture in order to avoid specular reflections. This reduces stray radiation to the radiation sensor caused by internal reflections or scattering in the housing. Still further, the inside surfaces may be provided with one or more radiation traps, which attenuate received radiation by one or more reflections inside the trap, and/or one or more controlling surfaces which reflect impinging radiation away from the radiation sensor, optionally into a radiation trap.

According to another aspect of the invention, it relates to an analysis system, which comprises an optical system according to the invention, a PCB implementing said common substrate, and an image processor for analysing image information received from the radiation sensor, wherein the optical system is supported by and the image processor is mounted on the PCB.

The optical system being supported by the PCB implies that the spatial positions of the components of the optical system are defined by their relation to the PCB, even though each component does not need to actually be mounted on or attached to the PCB. For example, a sensor boresight unit of the optical system need not be attached to the PCB. The arrangement of the optical system being supported on a PCB provides a well-defined spatial relationship between components of the optical system. Thus, a compact arrangement for the acquiring of images and the processing of the images may be provided. Further, the analysis system readily provides control of the radiation source, which is mounted on the PCB, and further provides simple and inexpensive connection of the radiation sensor to an image processor.

According to a further aspect of the invention, it relates to a modular unit for an electronic pen having a writing implement, said modular unit comprising a carrier, and an analysis system according to the invention being mounted on the carrier, said carrier having means for receiving said writing implement in order to position the writing implement in relation to the analysis system within the electronic pen.

This arrangement of a modular unit provides a possibility to test the quality of the analysis system before the electronic pen is finally mounted by inserting the modular unit into an outer shell of the electronic pen. Thus, defects in the analysis system may be detected at an earlier stage in production, whereby fewer steps need be made for defective products. This speeds up and improves the production process.

Since the analysis system is mounted on the carrier and the carrier provides a means for receiving a writing implement, the spatial relationship between the analysis system and the writing implement is defined by the design of the carrier. This implies that the imaged area and the irradiated area are accurately defined in relation to a pen point of the writing implement in contact with the object. Further, the mutual mounting on the carrier of the analysis system and the writing implement implies that the modular unit provides a short tolerance chain of the relation of the imaged and irradiated areas to the pen point.

The term "modular unit" should be construed as a unit that may be assembled and which is not held together by pieces that do not form part of the unit. In this case, the modular unit for the electronic pen forms an integral unit before final assembly of the electronic pen.

The modular unit suitably has a dimension allowing the modular unit to be mounted inside the electronic pen. Thus, in the assembly of the electronic pen, the modular unit may be arranged within the outer shell of the electronic pen.

The PCB of the analysis system may be mounted on the carrier for mounting the analysis system on the carrier. Thus, the position of the PCB may be fixed by the carrier. This implies that the insertion of the modular unit into the outer shell of a pen need not comprise securing the PCB to the shell.

The carrier may have an elongate shape which extends, when the modular unit is incorporated in an electronic pen, in a longitudinal direction of the electronic pen. Hereby, the carrier may provide possibility to fix the position of several components of the pen along the longitudinal shape of the pen.

The modular unit may further comprise a contact sensor which is mounted on the carrier. The contact sensor may detect when the writing implement is pressed against a writing surface. This detection may activate the optical system to irradiate and image the writing surface, which forms the object. The contact sensor's functionality may be obtained by components arranged integrated on the carrier or may, alternatively, be obtained by a contact sensor unit that is mounted on the carrier.

The modular unit may also comprise means for forming attachment to an outer shell part of the electronic pen. Thus, the modular unit is prepared for installation in the pen shell. The means for forming attachment could be a hook or pin for engaging the outer shell part or a slot or recess for receiving a protrusion from the outer shell part.

Further, the modular unit may comprise a vibrator unit, which is mounted in the carrier. The vibrator unit may by vibration provide feedback to the user e.g. when the electronic pen fails to appropriately image the writing surface.

Moreover, the modular unit may comprise a wavelength filter mounted on the carrier. The wavelength filter may be arranged such that the radiation from the object passes the wavelength filter before being detected by the radiation sensor. Thus, undesired wavelengths for the analysis to be performed by the analysis system may be filtered out.

According to a still further aspect of the invention, it relates to a modular unit for an electronic pen having a writing implement, said modular unit comprising a carrier with a receiver for the writing implement, a PCB, a two-dimensional radiation sensor mounted on the PCB, and an imaging unit which defines an image plane, wherein the carrier, the PCB, and the imaging unit are joined together with the imaging unit facing the radiation sensor to locate the image plane at the radiation sensor.

The carrier provides for control of the location of the writing implement. The carrier can be manufactured with adequate precision in a separate manufacturing step. The provision of the radiation sensor on the PCB allows for a simple and durable construction, which can be manufactured in a cost-effective way. For example, the radiation sensor can be attached to and tested together with the PCB in a separate manufacturing step. The imaging unit may be of simple and durable construction and can be manufactured with adequate precision in a separate manufacturing step. The imaging unit may be the above-mentioned sensor boresight unit. The joining of the carrier, the PCB, and the imaging unit allows for a modular unit with adequate control of opto-mechanical tolerances which, i.a., affect the mutual relation between the tip of the writing implement and the image recorded by the radiation sensor. Further, such a modular unit may be subject to quality tests before final assembly of the electronic pen, thereby allowing for defects to be detected at a relatively early stage in production.

The modular unit may comprise a radiation source for illuminating an object plane defined by the imaging unit. In one embodiment, the imaging unit comprises a holder for carrying the radiation source. This results in a simple and durable construction providing a short tolerance chain between the radiation source and the imaging unit. Further, the radiation source is kept in a close relationship to the imaging unit, whereby the above-mentioned effects of pen orientation on the relationship between imaged and irradiated areas on a writing surface is minimized.

In one embodiment, the imaging unit is supported by the PCB. Thereby, the PCB may define the position of the imaging unit. However, the imaging unit need not be actually mounted or attached to the PCB. The sensor boresight unit may, for example, be attached directly to the carrier while being supported by the PCB. Since the PCB at least partly defines the position of the imaging unit, a short tolerance chain between the imaging unit and the radiation sensor may be obtained.

According to still another aspect of the invention, it relates to a sensor boresight unit for transmitting radiation from an object to a radiation sensor, said sensor boresight unit comprising a housing, which provides an internal channel that changes direction at a turn within said housing and further provides a radiation entrance end and a radiation exit end of said channel, a lens, which is mounted in the internal channel at said radiation entrance end of said housing, and a mirror, which is mounted in the housing at said turn of the internal channel for redirecting radiation along the change of direction of the internal channel.

According to yet another aspect of the invention, it relates to an optical component for transmitting radiation from an object to a radiation sensor, said optical component being formed by a solid body defining a radiation path within the body, said solid body comprising a radiation entrance surface for receiving radiation into said radiation path, said entrance surface including a lens element, a radiation exit surface, a tubular part for transmitting radiation in the radiation path along a longitudinal axis of the tubular part, and a mirror surface at an end of the tubular part opposite the entrance surface, wherein a normal of the mirror surface is slanted to the longitudinal axis of the tubular part such that the radiation path is redirected in the mirror surface towards the radiation exit surface of the solid body.

Both these last-mentioned aspects of the invention respectively provide devices for transmitting of radiation from an object to a radiation sensor. This transmitting of radiation may advantageously be used in an imaging system for collecting radiation from the object and redirecting the radiation towards a radiation sensor. Thus, these devices respectively enable positioning of the radiation sensor more freely in relation to the object to be imaged by the radiation sensor.

According to a still further aspect of the invention, it relates to an electronic pen arrangement, comprising a writing implement, an optical system which is designed to generate an image of a writing surface on which the pen is operated, said image including part of the writing implement, and a processing unit which is designed to derive data indicative of a position, based upon a position-coding pattern in said image and based upon the location of said part in the image.

By designing the optical system to include part of the writing implement in the recorded images, the processing unit is capable of accurately relating a decoded position, given by the position-coding pattern, to the actual writing position, i.e. the position of the point of contact between the writing implement and the writing surface. Thus, the processing unit may be self-calibrating with respect to any variation, over time or between pens, in the location of the image to the actual writing position. In one embodiment, the processing unit is arranged to calculate, based upon the image, the spatial orientation of the pen and a decoded position. Knowing the position, the spatial orientation and the location of the aforesaid part in the image, the processing unit may calculate the actual writing position. During normal operation of the pen arrangement, the processing unit need not derive the location of the part in the images; instead the calculation of the actual writing position may be based on a calibration parameter which has been derived, in a preceding calibration step, from the location of the part in one or more images. In one embodiment, the electronic pen arrangement is unitary, with the writing implement, the optical system and the processing unit being incorporated in a pen device. In another embodiment, the writing implement and the optical system are incorporated in a pen device, whereas the processing unit is located in a separate device.

Other objects, advantages and features of the invention are set out in the following detailed description of the invention, in the attached claims and in the drawings.

BRIEF DESCRIPTION OF THE DRAWINGS

The invention will now be described in further detail with reference to the accompanying schematic drawings, which by way of example only illustrate embodiments of the invention.

FIGS. 1a and 1b illustrate angles defining an orientation of an electronic pen in relation to a writing surface.

FIG. 2 illustrates relations between contact point, imaged area and irradiated area for an optical system of the electronic pen.

FIG. 5 is a perspective view of components of a modular unit for the electronic pen before being assembled.

FIG. 6 is a perspective view of the components of the modular unit of FIG. 5 after being assembled.

FIG. 7 is a side view of an ink cartridge and illustrates the effect of a radial gap between the ink cartridge and a receiving bore of the pen.

DETAILED DESCRIPTION OF EMBODIMENTS OF THE INVENTION

Figure 3:
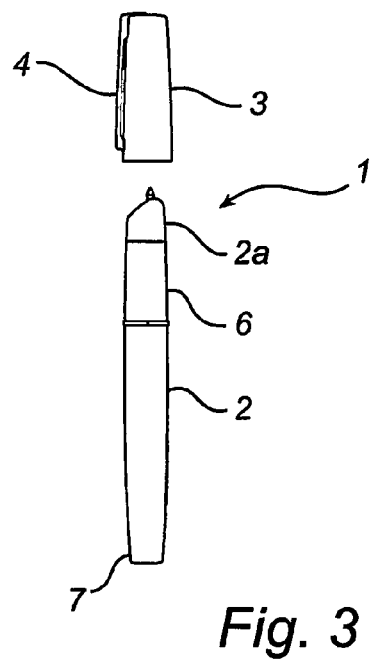
FIG. 3 is a side view of the electronic pen.

Referring now to FIGS. 1-4, the parts and components of an electronic pen and the functionality of the pen will initially be summarily described. Although the invention is not restricted to its use in an electronic pen, an embodiment of the invention as used in an electronic pen will illustrate the features and functionality that may be obtained according to at least some aspects of the invention.

It should be apparent to the skilled person that features, advantages and objectives described only in connection with a particular embodiment below may be equally applicable to the other embodiments as disclosed below.

Designing an Optical System for an Electronic Pen

In FIGS. 1a-b, an ink cartridge 8 of an electronic pen 1 is shown. The ink cartridge 8 comprises a pen point 9, which will contact a writing surface 14, when a user is writing. The writing surface 14 comprises a pattern, which carries information on the writing surface 14. The pattern may encode a position on the surface 14 or general information regarding what the writing pertains to. This may be used for calculating the movement of the pen point 9 and/or for registering if writing is made in a special area on a paper, such as a check box or a date in a calendar. In order to decode the pattern on the writing surface, the pen 1 comprises an imaging system 15 (FIG. 4) for imaging an area on the surface 14. Using the imaged area, the pen 1 may determine the position of the pen point 9 on the surface 14. The imaging system 15 comprises a focussing lens for obtaining a sufficiently sharp image of the imaged area. Further, in order for the imaging system 15 to adequately image the area on the surface 14, this area should be irradiated by a radiation source.

When a user writes, the orientation of the ink cartridge 8 in relation to the surface 14 will vary. Ideally, an area centred on the pen point 9 is imaged, to minimize any variations in the relation between the imaged area and the pen point 9 resulting from the varying pen orientation. However, this may be difficult to achieve, since the optical axis of the imaging system 15 would then have to be placed coinciding with the longitudinal axis of the ink cartridge 8. Further, the ink cartridge 8 and the pen point 9 may then obscure the imaged area. Thus, the imaging system 15 is arranged to image an area adjacent to the pen point 9. Thereby, the relation between the imaged area and the pen point 9 will depend on the orientation between the ink cartridge 8 and the surface 14, as will be explained below.

In FIGS. 1a-b, the orientation between the ink cartridge 8 and the writing surface 14 is illustrated. This orientation may be described by using three angles. As shown in FIG. 1a, the ink cartridge 8 forms an inclination angle θ, which is defined as the tilt angle between the longitudinal axis A of the ink cartridge 8 and the normal of the surface 14. The inclination angle θ may vary substantially during writing. Further, as shown in FIG. 1a, the pen 1 may be rotated around the longitudinal axis A. Since the imaging system 15 is not arranged on this axis, such a rotation will affect the relation between an imaged area and the pen point 9. The rotation of the pen 1 around the longitudinal axis A is called a skew angle Φ. Moreover, as shown in FIG. 1*b*, the pen 1 may be rotated in relation to the pattern on the surface 14. This rotation around the normal of the surface 14 is called a pattern rotation angle α.

Referring now to FIG. 2, the effects of differing inclination angle θ between the ink cartridge 8 and the writing surface 14 is illustrated. Three different writing surfaces $WS_0$, $WS_{-45}$, $WS_{45}$ are shown to illustrate differing inclination angles, namely θ=0°, θ=−45°, and θ=45°, respectively, between the ink cartridge 8 and the writing surface 14. As shown in FIG. 2, the surface 14 is arranged at different positions along an optical axis C of the imaging system depending on the inclination angle θ. Thus, the distance between a radiation sensor of the imaging system 15 (FIG. 4) and the imaged area on the writing surface 14 will also depend on the inclination angle θ. The inclination angles θ that are allowed during writing define a range of distances between the imaged area and the radiation sensor, at which the radiation sensor should detect the imaged area with an adequate sharpness over relevant parts of the imaged area for decoding the pattern on the surface 14. This range of distances is called the depth of field requirement FD of the imaging system 15. As seen in FIG. 2, this necessary depth of field FD is proportional to the distance D in a reference plane, which in this case is the plane of the writing surface at inclination angle θ=0, between the contact point P, i.e. the pen point 9, and the optical axis C of the imaging system 15. In order to provide a large depth of field, the imaging system 15 should have a high f-number, which results in low amounts of radiation being passed to the radiation sensor. If luminosity is critical, it may therefore be desirable to keep the optical axis offset or distance D to a minimum.

The imaging system 15 images an area on the surface 14, which is the field of view of the imaging system 15. Since the absolute magnification (|m|) of an object onto an image plane in the radiation sensor is inversely proportional to the distance between the object and the lens of the imaging system 15, the absolute magnification of the field of view will increase with increasing inclination angle θ between the ink cartridge 8 and the surface 14. The field of view that is imaged onto an active area on the radiation sensor is smaller at a larger absolute magnification. The imaging system 15 should image an area on the surface 14 which holds sufficient amounts of information for decoding a pattern on the surface 14. The field of view should therefore be large enough to allow imaging of a decoding area DA. Thus, an upper limit of the absolute magnification is set in order for the field of view to include a decoding area DA. Further, a lower limit of the absolute magnification is set in order to enable discrimination of the smallest relevant details of the pattern. Also, by keeping the necessary depth of field FD as small as possible, the variation in the magnification of the imaged area is minimized.

However, to keep the necessary depth of field FD as small as possible, the field of view should be arranged next to the tip of the ink cartridge 8. Thus, there is a risk that the field of view becomes partly obscured by the tip of the ink cartridge 8. If the ink cartridge 8 obscures a large part of the field of view, the imaged area of the surface 14 may not be large enough to enable decoding of the pattern. This implies that the distance D should not be designed too small. If an angle between the optical axis C and the longitudinal axis A (FIG. 2) of the ink cartridge 8 is increased while keeping the distance D constant, the obscuration of the tip of the ink cartridge 8 in the field of view may be reduced. However, a greater angle also implies that the optical axis C is further apart from the longitudinal axis A inside the pen 1, resulting in a larger radius of the pen 1.

As briefly mentioned above, at least the relevant parts of the imaged area, i.e. the decoding area DA holding the pattern to be decoded, should be irradiated. This may easily be ensured, if an optical axis I of an irradiating system 13 is arranged coincident with the optical axis C of the imaging system 15. However, if the optical axes C, I of the imaging and irradiating systems 15, 13 are arranged to coincide, optical components on the coinciding optical axes need to be adapted to perform functions of both the imaging and irradiating systems 15, 13. This may result in loss of radiation in the optical components. On the other hand, if the optical axes C, I are arranged not to coincide (FIG. 2), the relation between the imaged area and the irradiated area will depend on the angles between the ink cartridge 8 and the writing surface 14. Then, the design of the pen needs to arrange the irradiating system 13 such that the irradiated area always includes the relevant parts of the imaged area for all allowed angles between the ink cartridge 8 and the writing surface 14. The irradiating system 13 should irradiate the decoding area DA properly, for example with sufficiently uniform radiation of a sufficient magnitude (irradiance). The uniformity may be defined by the largest difference in irradiance and/or the irradiance gradients within the decoding area DA.

The accumulated decoding areas DA for all allowed angles between the ink cartridge 8 and the surface 14 define a space that is to be irradiated. As described above, this space depends on the design of the pen 1, i.e. on the distance D, the decoding area DA, the angle between the optical axis C and the longitudinal axis A of the ink cartridge 8 and the allowed angles between the ink cartridge 8 and the surface 14. Thus, the irradiating system 13 should be arranged to emit radiation in such a large solid angle γ that it covers the space to be irradiated. Placing the optical axis I of the irradiating system 13 close to the optical axis C of the imaging system 15 implies that the required solid angle y is kept relatively small. The properties of the irradiating system 13 needed for obtaining the required solid angle y could be designed by calculating the irradiation pattern using a ray-tracing program.

Above, the effects of differing inclination angles θ have been explained. Further, differing skew angles affect the requirements on depth of field FD and the irradiated space. Again, increasing the distance D implies that a larger depth of field FD and a greater irradiated space are needed when varying skew angles are allowed.

When the pattern rotation angle a is changed, the encoded pattern viewed by the imaging system 15 will be changed. This needs to be accounted for in calculation of the position of the pen point 9 on the surface 14. Allowing all pattern rotation angles a implies that the required size of the imaged area of the writing surface is essentially defined by a circle formed by rotating the decoding area DA over 360°. However, varying the pattern rotation angle αwill not affect the size of the area being imaged, the distance of the imaged area to the radiation sensor or the distance D.

Effect of Tolerances

The pen 1 is designed with nominal parameters, such as sizes and relative mounting angles and distances, for all components of the pen 1. This design gives a nominal value of the distance D. However, in manufacturing the pen 1 tolerances to the nominal parameters should be allowed. Tolerance chains add up to set requirements on allowed largest value of the distance D. This largest value sets the requirement on the depth of field FD of the imaging system 15. Further, tolerance chains add up to define possible needed irradiated spaces.

In designing the pen 1, the above-explained parameters of the imaging and irradiating systems 15, 13 should be considered. If the nominal distance D between the pen point 9 and the optical axis C of the imaging system 15 in the reference plane is decreased, the nominal depth of field FD may be reduced. This implies that an opening of an aperture stop in the imaging system 15 may be increased allowing more radiation to reach the radiation sensor. Thus, the power of the radiation source may be reduced, whereby battery lifetime of the pen 1 is increased. The decreased distance D may alternatively be used to allow the pattern on the writing surface 14 to comprise smaller details, while the imaging system 15 is unchanged. The decrease in the nominal distance D may as a further alternative be used for allowing larger differences in the angles between the ink cartridge 8 and the writing surface 14, while keeping the nominal depth of field FD constant. Further, the decrease in the nominal distance D may be used for allowing larger tolerances in individual components of the pen 1 or in the assembly of the components.

These parameters, i.e. the nominal distance D, the nominal depth of field FD, the scale of the details on the writing surface 14, the allowed variation in the angles between the ink cartridge 8 and the surface 14, and the allowed tolerances may be varied in several different ways, wherein a change in the requirement of one parameter may cause changes in the requirements of one or more of the other parameters.

Figure 4:
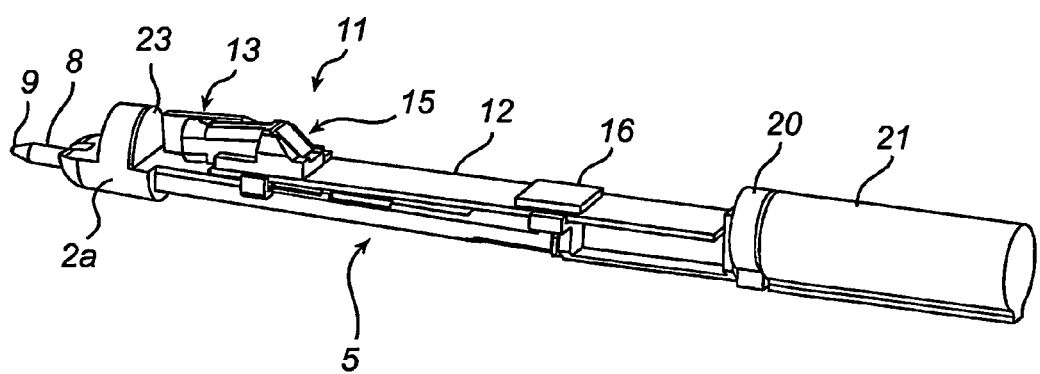
FIG. 4 is a perspective view of a modular unit in an electronic pen, where the outer shell of the pen has been removed.

With insufficient control of the tolerance chain, the distance D may thus for some pens be so great that the imaging system 15 is not capable of supplying useful images to the processor 16 (FIG. 4). This may be solved by constructing the imaging system 15 with a great nominal depth of field by decreasing the opening of an aperture stop and/or decreasing the focal length of an imaging lens. This, however, may cause an undesirable restriction on the amount of radiation that can be transferred to the radiation sensor.

The presently preferred embodiments are designed to handle decoding areas DA of approximately 3-5 mm. The distance D is suitably set in the range of about 2-4 mm, and the necessary depth of field FD is suitably set in the range of about 2.5-10 mm, preferably in the range of about 4-8 mm, and most preferably in the range of about 6.5-7.5 mm. Preferably, the optical system is designed to allow for a symmetric range of inclination angles $\theta$, for all skew angles $\Phi$, so as to allow the user to grip and write with the pen at any skew angle. Preferably, the range of allowable inclination angles comprises about $\pm 30°$, and preferably about $\pm 40°$, and most preferably $\pm 45°$. Preferably, the imaging system is designed with a length of the optical axis C, from the writing surface to the radiation sensor at $\theta=0°$ and $\Phi=0°$, in the range of about 15-60 mm, preferably about 30-45 mm. At the lower limit, the imaging system may require an undesirably small aperture stop and exhibit significant image aberrations, e.g. distortion. At the upper limit, the imaging system may take up significant longitudinal and radial space in the pen and/or require an optically redirecting element at the front end of the pen.

Embodiments

Below, some embodiments of imaging and irradiating systems within a pen 1 will be described, illustrating ways of designing the pen 1 to meet the above-mentioned requirements.

The pen 1 in FIG. 3 has a body 2 with a forward portion 2a and a cap 3 with a clip 4. The forward portion 2a is formed by a projecting end of a carrier 5, as illustrated in FIG. 4, which is arranged to extend within a hollow casing 6 towards a rear portion 7 of the pen 1.

An ink cartridge 8 with a pen point 9 is inserted into a receiver 10 in the carrier 5, as illustrated in FIGS. 5-6. The receiver 10 provides a through bore 10a in the forward portion 2a of the pen 1 and a longitudinal groove 10b aligned therewith. The ink cartridge 8 is slid into the receiver 10 and may be replaced by a user. Between the ink cartridge 8 and the receiver 10 there is a certain radial play.

Returning now to FIG. 4, a printed circuit board (PCB) 12 is mounted on the carrier 5 to extend parallel to the ink cartridge receiver 10. An optical system 11 is attached to the PCB 12. The optical system 11 comprises an irradiating system 13 for emitting and directing radiation towards an object, which is typically a writing surface, such as a paper, on which the user writes using the pen 1. The optical system 11 further comprises an imaging system 15 for collecting and detecting radiation from the object in order to record images of the object. The irradiating and optical systems operate under the control of the processor 16 on the PCB 12, which processor may implement an image processor that receives and analyses the recorded images.

The pen 1 further comprises a means for providing power to the processor 16, the optical system 11 and any other parts of the pen 1 that need electric power. The means for providing power may be a battery 21 or a flexible cord (not shown) for connection to an external source of power. The pen 1 may further comprise a means (not shown) for enabling connection to an external computer unit for transfer of recorded images or information from the processor 16. The means for enabling connection to an external computer unit may be a wireless transmitter/receiver, a cradle connector (docking station) or any kind of wire connection, such as a USB-connector.

When the pen 1 is not used, the cap 3 is normally arranged over the forward portion 2a of the pen 1 to protect the pen point 9 and other components thereat. The clip 4 can then be used to fix the pen 1, for instance, in a shirt pocket. When the pen 1 is to be used, the cap 3 is removed and the processing circuitry of the pen 1 is set in a standby mode, wherein the pen 1 is sensible for activating actions. Techniques for sensing cap removal and selectively activating controlling electronics of the pen are further disclosed in Applicant's publications US 2002/0175903 and WO 03/069547, which are herewith incorporated by reference.

The pen 1 further comprises a contact sensor arrangement 17, which is mounted in a contact sensor receiving pocket 18 on the carrier. The contact sensor arrangement 17 is installed at the distal end of the receiver groove 10b. The contact sensor arrangement 17 receives a rear end of the ink cartridge 8, when inserted into the receiver 10. When the pen point 9 is pressed against a writing surface 14, the ink cartridge 8 will be pressed towards a contact sensor 19 attached to a wall of the pocket 18. The detection of a sufficient pressure via the contact sensor 19 is used to fully activate the controlling electronics, such as the processor 16, and thereby also activating the irradiating system 13, the imaging system 15, etc. If the output signal of the contact sensor represents the amount of exerted pressure, a pressure value may be associated to the corresponding image recorded at the same time, for example to be used in subsequent rendering of electronic pen strokes.

In the embodiment of FIGS. 5-6, the rear end portion of the ink cartridge 8 is inserted and press fitted into an insert 22, which is movably arranged in the pocket 18. The contact sensor 19 is attached to a wall in the space defined by the pocket 18. The space is defined so that the insert 22 can move towards and away from the contact sensor 19, but simultaneously so that the insert 22 cannot move out of the pocket 18. The insert 22 is designed to hold various makes of similar ink cartridges, which makes it possible to use exchangeable ink cartridges for ordinary ball point pens. The insert 22 ensures good contact with the contact sensor 19 when the pen point 9 of the ink cartridge 8 is pressed against the writing surface 14 and reduces the risk of ink possibly leaking out damaging the contact sensor 19. The design of the pocket 18 causes the insert 22 to stay in place when an ink cartridge 8 is removed from the pen 1 to be exchanged. The radial play between the ink cartridge 8 and the receiver 10 ensures that the ink cartridge 8 can be removed from the pen 1 with minor resistance only. When mounting a new ink cartridge 8, the receiver 10 ensures that the ink cartridge 8 is correctly positioned in the interior of the pen 1.

It is conceivable to essentially eliminate the radial play between the cartridge 8 and the receiver 10, in order to tighten the relationship between the pen point 9 and the imaging system 15. However, since the pen point 9 generally has a non-zero radial extension, the part of the pen point 9 being in actual contact with the writing surface 14 will vary with the inclination angle and the skew angle of the pen 1. This causes an inaccuracy in the determination of the pen point location on the writing surface 14. A ballpoint pen typically has a pen point (roller ball) with a diameter of about 0.5 mm. For inclination angles of ±45°, the above inaccuracy is about 0.35 mm, which is large enough to be visible if the handwriting is reproduced against a ruled background that represents the writing surface. It is possible to calculate a compensation value to minimize this inaccuracy, if the geometry of the pen point 9 is known, as well as the instant inclination and skew angles. However, it has been found that these inaccuracies instead can be lowered by careful design of the total radial play. FIG. 7 shows the ink cartridge 8 at two extreme inclinations: +45° (solid lines) and −45° (dashed lines). As can be seen, the actual contact point remains essentially constant. This may be achieved by the size of a radial gap RG being set equal to the effective diameter of the area that is defined by the location of the contact point on the pen point 9, at the extreme pen inclination angles for a zero radial play embodiment, as projected onto a plane perpendicular to the longitudinal axis of the ink cartridge 8. In practice, the radial gap RG is set to about 40-90% of the effective diameter, to take into account that the pen point 9 generally sinks into the writing surface 14 during writing.

The mounting of the contact sensor arrangement 17 in the pocket 18 (FIGS. 4-5), which has a well-defined position on the carrier 5, minimises risk of mutual misalignment of the ink cartridge 8 and the contact sensor arrangement 17. Such misalignment may interfere with the axial motion of the ink cartridge 8, so that an arbitrary delay is introduced in the contact sensor's detection of the pen's contact with the writing surface. Furthermore, such misalignment may cause wear on the insert 22 and/or the contact sensor 19. The mounting of the contact sensor arrangement 17 on the carrier 5 may also reduce the pen's susceptibility to mechanical shocks.

The carrier 5 may also be effective in protecting the electronic circuits of the pen against electrostatic discharge (ESD), in the form of over-voltage discharges or sparks over small insulating gaps, e.g. air gaps, between conductive members in the pen 1. ESD may cause serious damage to the electronic circuits and/or latch-up thereof. The problem of ESD may be enhanced in electronic pens, since electrical charge may travel into or out of the pen 1 via the ink cartridge 8, which is often made of metal. In the embodiment of FIGS. 4-6, all such small gaps between the cartridge/contact sensor and the PCB 12 are effectively eliminated by the receiver 10 and the pocket 18 being located on one side of carrier 5, and the electronic circuitry (PCB 12, processor 16, etc) being located on an opposite side of the carrier 5. The carrier material is continuous, i.e. there are no through holes, at least not in the surfaces defining the receiver 10 and pocket 18.

Further, mounting the contact sensor arrangement 17 on the carrier 5 provides the possibility of testing this functionality of the pen 1 before the pen 1 is finally assembled. Thus, the final assembly need not be made if defects are detected to the functionality of the pen 1.

It should also be appreciated that other types of sensors may be used to activate the pen 1 when the pen point 9 is pressed against a writing surface. For instance, part of an open electric circuit (not shown) may be arranged in the position of the contact sensor 19. In this case, the insert 22 is provided with conductive pins or a conductive sheet which, as the pen point 9 is being pressed against the writing surface, contacts and closes the electric circuit. Alternatively, an optical or magnetic detector can be used to sense the motion of the ink cartridge 8. Aforesaid WO 03/69547 describes a contact sensor that may be used in connection with the present invention.

The pen 1 further comprises a vibrator 20, which is attached to a rear end wall of the carrier 5. The vibrator 20 is connected to control equipment on the PCB 12. The vibrator 20 may vibrate for giving feedback to the user. For instance, when the pen 1 has detected that the user has ticked a checkbox, the vibrator 20 may vibrate for signalling to the user that the pen 1 has correctly detected that the checkbox was ticked. Further, when the pen 1 detects an error, the vibrator 20 may vibrate continuously, for example when the pen 1 does not recognize a pattern on the surface 14 which it expects to recognize.

The carrier 5 and the parts mounted on the carrier 5, such as the PCB 12, the optical system 11, the contact sensor arrangement 17, the vibrator 20, and the ink cartridge 8 form a modular unit for the pen 1. This modular unit can be tested for functionality and resistance to certain outer conditions without the need for final assembly of the pen 1. This provides that defective modular units may be discarded or corrected before final assembly of the pen 1. Further, the arrangement of all these parts in one modular unit provides the possibility that the modular unit is delivered by a subcontractor to a pen manufacturer or pen dealer. The pen manufacturer/dealer need then merely package the modular unit with a battery and any other desired or needed parts in an outer shell or casing before marketing the pen 1. It may also be conceivable that the battery forms a part of the modular unit. In either case, the modular unit may provide the basic functionality of the pen 1.

When a user writes with the activated pen 1, an area on the writing surface adjacent or around the pen point 9 is irradiated by the irradiating system 13 of the optical system 11. The imaging system 15 of the optical system 11 records images of an irradiated area of the surface 14 adjacent the pen point 9, and the processor 16 calculates the position of the pen 1 based on the images. Here, a specific position-coding pattern (not shown) on the surface 14 may be used, for instance of the type as described in U.S. Pat. Nos. 6,570,104, 6,674,427, US 2001/0038349, US 2003/0066896, U.S. Pat. Nos. 5,477,012 and 6,330,976. With the aid of the pattern on the writing surface, the position of the pen 1 can at any moment be determined, and in this way the user's writing can be recorded.

In order to achieve good image quality, the area imaged by the imaging system 15 needs to be properly irradiated by the irradiating system 13. This is achieved, as explained above, by the irradiating system 13 emitting radiation in a solid angle y that covers a space formed by the possible positions of the imaged area dependent on e.g. the angles between the pen 1 and the writing surface and the tolerances in the components of the pen 1.

Figure 8:
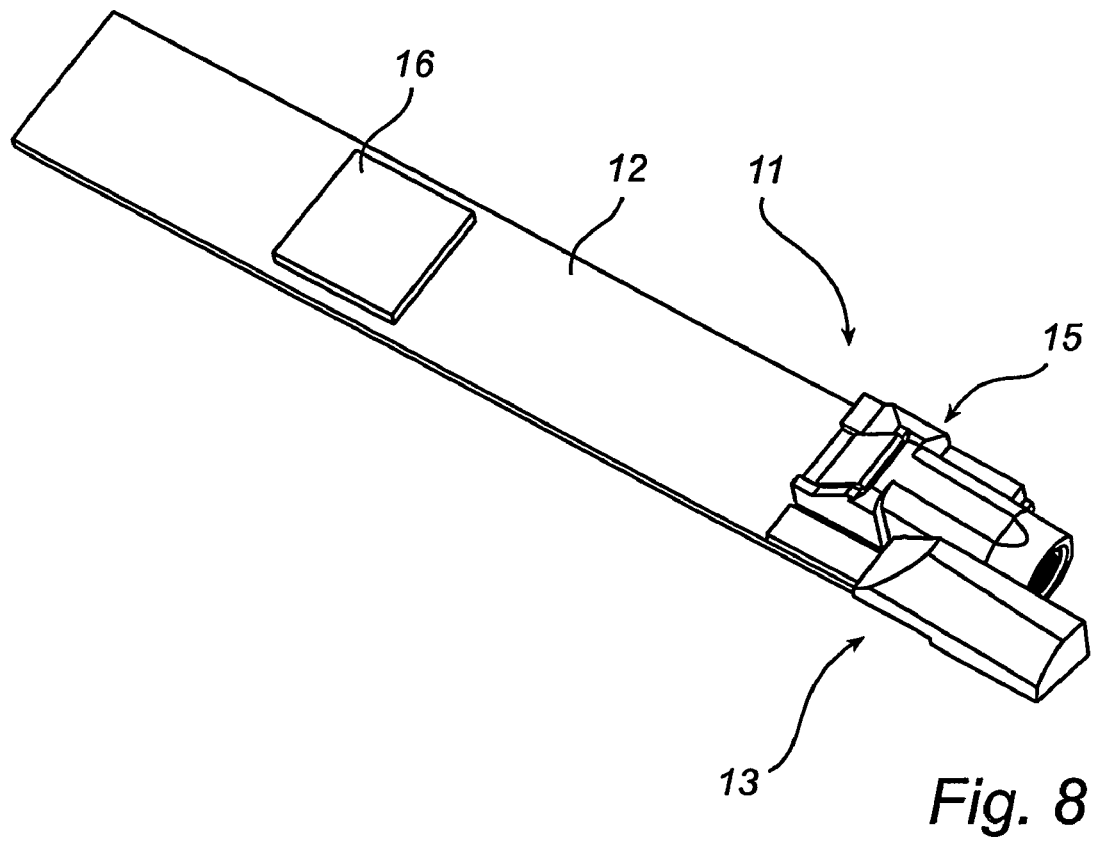
FIG. 8 is a perspective view of an analysis system comprising an optical system and a processor.

Referring now to FIGS. 8-12, an analysis system will be described. The entire analysis system is shown in FIG. 8, whereas parts of the analysis system are shown in detail in FIGS. 9-12. The analysis system comprises the PCB 12, on which the processor 16 is arranged and on which the optical system 11 is mounted. The analysis system may be used for irradiating an object and imaging the thus-irradiated object. The recorded images may be analysed in the processor 16, which is connected to the imaging system 15 on the PCB 12. Thus, the analysis system provides an analysis functionality, which may be used in differing optical analysis applications. The analysis system is particularly suitable for use in handheld devices, wherein an object is to be analysed based upon images of the irradiated object. The analysis system will below be described in relation to the application of the analysis system in an electronic pen, but it should be emphasized that the scope of protection of the present application is in no way limited to this use of the analysis system. It may, for instance, be applied in a bar code reader instead.

The analysis may be achieved in each specific application by programming the processor 16 to perform image analysis. The image processor 16 may perform pre-processing of the images, and optionally extract information from the images, whereas an external computer unit may calculate coordinates on the writing surface 14, based upon the pre-processed images or the extracted information, as the case may be. Alternatively, the image processor 16 performs all processing on the information in the images. Alternatively, all or parts of the image processor 16 may be integrated in the radiation sensor 24. In one embodiment, the image processor 16 is implemented as an application-specific integrated circuit (ASIC).

The analysis performed is highly dependent on the application of the analysis system and the needed information from the recorded images. Therefore, in the following description, referring now to FIGS. 9-12, the optical system 11 of the analysis system will be described in detail, whereas the function of the processor 16 will be only briefly discussed.

As shown in FIG. 8, the irradiating system 13 and the imaging system 15 are arranged adjacent to each other. Thus, the effect of varying angles between the pen point 9 and the writing surface 14 on the relationship between the irradiated area and the imaged area is kept low.

The optical system 11 may, as shown in FIG. 8, be mounted on the PCB 12. This is a rigid and simple assembly of the optical system 11.

Figure 9:
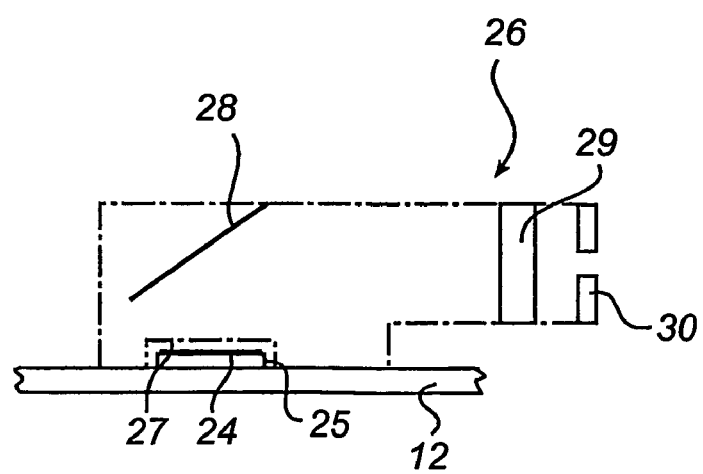
FIG. 9 is a side view of an imaging system of the optical system.

Referring now to FIG. 9, the imaging system will be schematically described. The imaging system comprises a two-dimensional radiation sensor 24. The two-dimensional radiation sensor 24 may be an electro-optical image sensor, such as a CCD or a CMOS sensor. The radiation sensor 24 may be arranged in a package 25 that is soldered to the PCB 12. Alternatively, a sensor chip may be attached directly to the PCB 12, for example via wedge or ball bonding. The radiation sensor 24 is connected through the PCB 12 to the image processor 16 for control and analysis.

The imaging system further comprises a sensor boresight unit or imaging unit 26 for directing radiation onto the radiation sensor 24. In the embodiment of FIG. 9, the boresight unit 26 is mounted on the PCB 12 surrounding the radiation sensor 24. The boresight unit 26 has a sensor pocket 27 to receive the package 25 with the sensor 24. Thus, only radiation that propagates through the boresight unit 26 will reach the sensor 24. The boresight unit 26 comprises a mirror 28, which is arranged above the sensor 24. The mirror 28 is arranged to reflect radiation from the writing surface onto the sensor 24, and to redirect the optical axis of the imaging system accordingly. The mirror surface need not be planar, but a slightly curved mirror surface is also conceivable.

The redirection of radiation by the mirror 28 allows the sensor 24 to be mounted on the PCB 12, which extends away from the writing surface in a direction substantially perpendicular thereto. The radiation is redirected essentially 90° in the mirror 28, so that the optical axis of the imaging system in the optical path upstream of the mirror 28 is essentially parallel with the surface of the PCB 12. Thus, the PCB 12 will not obscure the field of view of the imaging system 15. The optical axis of the imaging system upstream of the mirror 28 may be somewhat inclined, typically by less than about 15°, preferably by less than about 10°, and most preferably by about 3°-8°, to the longitudinal axis of the ink cartridge, so that the imaging system will view an area of the writing surface close to the pen point.

The boresight unit 26 further comprises a lens 29 upstream of the mirror 28 in the optical path. The lens 29 is arranged to focus radiation from the writing surface onto the sensor 24 via the mirror 28. The lens 29 is arranged in the boresight unit 26 such that the distance between the lens 29 and the sensor 24 is shorter than the distance between the lens 29 and the writing surface, whereby the imaged area on the writing surface is increased. The boresight unit 26 should provide such demagnification that a sufficient area of the writing surface 14 is imaged on the sensor 24 to determine the position of the pen point 9. The imaged area may, however, not be demagnified to such a degree that the features required for decoding cannot be distinguished in the recorded image.

The boresight unit 26 also comprises an aperture stop 30. The aperture stop 30 reduces the amount of radiation passed towards the sensor 24. If an opening of the aperture stop 30 is increased, more radiation is passed towards the sensor 24, but the depth of field of the imaging system 15 is simultaneously decreased.

Figure 10:
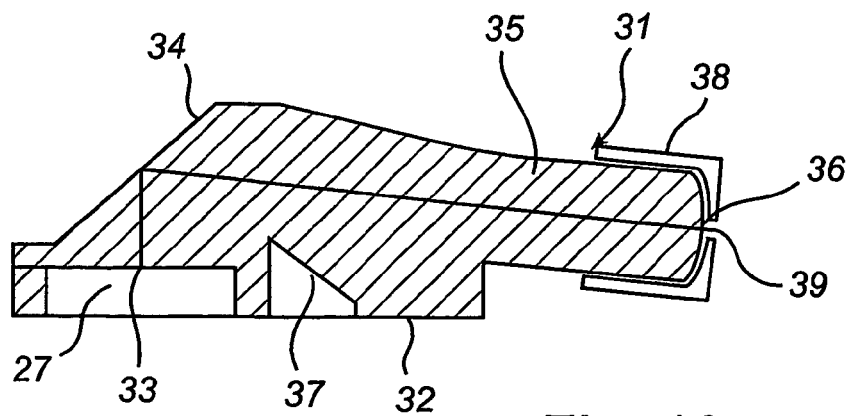
FIG. 10 is a sectional view of an embodiment of the imaging system.

In one embodiment, shown in FIG. 10, the lens and the mirror are implemented in one optical component 31. The optical component 31 is a solid optics component denoted herein as an imaging prism. The imaging prism 31 may be produced of a plastics material, such as polymethylmethacrylate (PMMA), polycarbonate Zeonex®, polystyrene, nylon, or polysulfone. The prism 31 has a base 32 to be attached to the PCB 12, e.g. by gluing, snapping, clamping or ultrasonic welding. The sensor pocket 27 is arranged in the base 32. The surface inside the pocket 27 of the prism 31 may be planar or slightly curved and forms a radiation exit surface 33 towards the radiation sensor. The prism 31 further has a mirror surface 34 which is arranged above the pocket 27 and inclined in relation to the base 32. The mirror surface 34 is metallized on the outside for providing a reflective surface. Thus, the radiation incident on the mirror surface 34 from within the prism 31 will be reflected in the mirror surface 34. Alternatively, a glass mirror is glued to the prism 31 by means of optical glue. The prism 31 also has an essentially tubular part 35 which extends from the mirror surface 34 and is at least partly supported by the base 32. The tubular part 35 extending from the mirror surface 34 is slightly inclined towards the geometrical plane of the base 32. Thereby, the optical axis may be tilted to the longitudinal axis of the ink cartridge 8, whereby the imaging system 15 may image an area close to the pen point 9. The proximate end of the tubular part 35 extends beyond the base 32. This end forms an entrance surface 36 of the prism 31. The entrance surface 36 includes a lens surface and is arranged to receive radiation from the object plane. The lens surface may be formed by any suitable refractive means, such as a curvature of the surface 36 and/or Fresnel zones in the surface 36.

All surfaces of the imaging prism 31 except for the entrance surface 36 and the exit surface 33, and optionally the mirror surface 34, may be covered with a radiation-transfer material. The radiation-transfer material has a refractive index that is sufficiently matched to the refractive index of the prism material, such that the major part of any radiation within the prism impinging on these covered surfaces is transmitted into the radiation-transfer material instead of being reflected back into the prism. The radiation-transfer material may also be selected to absorb the relevant wavelengths, typically with an absorbance of at least 0.5, to prevent the transferred radiation from spreading within the pen casing. The provision of a radiation-transfer material on the outside of the imaging prism prevents stray radiation from reaching the radiation sensor. Since an effective prevention of internal reflections in the prism is provided, the surfaces of the prism may be arranged close to the desired optical path in the prism. Thus, the prism may have a small size. The radiation-transfer material may also be selected to prevent radiation from entering the prism through other surfaces than the entrance surface. In one embodiment, the radiation-transfer material is a black paint.

Further, there is provided a notch 37 in the base 32. This notch 37 forms a barrier in front of the radiation sensor as seen from the entrance surface 36 and provides that radiation is not allowed to impinge on the radiation sensor directly from the entrance surface 36 without interacting with the mirror surface 34.

In this embodiment, the boresight unit 26 consists of the prism 31 and an aperture stop 38. The aperture stop 38 may be implemented as a cap to be mounted over the tubular part 35 of the imaging prism 31 at the entrance surface 36. The aperture stop 38 has an opening 39 to be arranged in front of the entrance surface 36 to allow radiation into the prism 31. The aperture stop 38 may be formed in plastics material and be glued or snapped onto the prism 31. The aperture stop 38 may alternatively be provided by masking a part of the entrance surface 36 that should not transmit radiation, e.g. with the radiation-transfer material used for the other surfaces of the prism 31.

Figure 11:
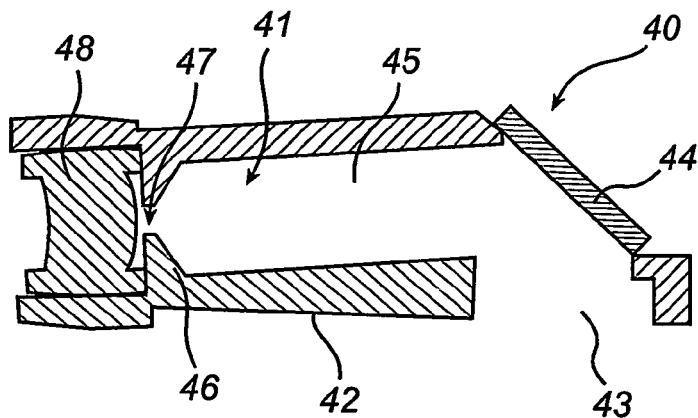
FIG. 11 is a sectional view of another embodiment of the imaging system.

In another embodiment, shown in FIG. 11, the boresight unit is implemented as a housing 40 containing the needed optical components. Radiation is propagated in a channel 41 formed in the housing 40. The housing 40 has essentially the same shape as the imaging prism 31 and thus a similar optical path is formed within the housing 40. A base 42 of the housing 40 may have a large surface towards the PCB 12. Further, the housing 40 may be formed in a material optimal for strongly attaching the housing 40 to the PCB 12 by e.g. gluing, snapping, clamping or ultrasonic welding. The housing 40 has an opening 43 in the base 42 forming the sensor pocket, which is open into the channel 41.

A mirror 44 is attached by e.g. gluing to cover an opening in the housing 40 above the opening 43 in the base 42. The housing 40 may provide slots (not shown) for receiving the mirror 44 and defining the position of the mirror 44. The housing 40 further provides a tubular part 45 of the channel 41 extending from the mirror 44. The housing 40 may have a thick base wall which forms the lower inside surface of the channel 41. At an end of the tubular part 45, inside walls of the housing 40 may have radial protrusions 46 for reducing the diameter of the channel 41 and effectively forming an aperture stop 47. The aperture stop 47 may be arranged a short portion into the channel 41 of the housing 40. The housing 40 further comprises an outer opening for receiving radiation from the writing surface 14. A lens 48 may be attached in the housing 40 upstream of the aperture stop 47, for example by means of gluing, crush ribs, ultrasonic welding, form fitting, snap fitting, etc.

As an alternative (not shown), the lens may be attached in the channel 41 downstream of the aperture stop. Typically, the lens is slid in the channel into a predefined position, e.g. into abutment with the aperture stop. Such downstream mounting may reduce the influence of assembly tolerances on the distance between the lens and the radiation sensor, since any deviations in the position of the lens from predefined position will counteract any deviations in the positions of the mirror to the holder and the holder to the radiation sensor. Similar advantages may be attained by mounting the mirror from the inside of the channel.

The aperture stop may alternatively be arranged as a separate component, which is inserted into and attached to the housing 40. Alternatively, the aperture stop may be provided by means of a cap that is arranged over the front end of the housing 40. Such a cap may also include the lens 48.

The housing 40 may be formed in a radiation-absorbing material for absorbing stray radiation. The inner surface of the housing 40 may also or alternatively be coated with a radiation-absorbing material. The inner surface of the housing 40 may be roughed or textured to reduce specular reflections. Alternatively or additionally, the inner surface of the housing 40 may have one or more controlling surfaces that direct specular reflections away from the opening 43. The downstream walls of the protrusions 46 forming the aperture stop 47, i.e. the walls facing the mirror 44, may be tapered away from the mirror. Thereby, reflections in these protrusion walls are steered into the walls of the housing 40. These protrusion walls may also be roughed or textured.

The position-coding pattern on the writing surface may be printed to be visible in the near infrared wavelength band. Further, the ink from the pen 1 may be chosen in order not to be visible in the near infrared wavelength band such that it will not interfere with the information of the position-coding pattern. In order not to image wavelengths in the visible region, an infrared filter 23 (FIG. 4) may be arranged in front of the lens of the imaging system 15. The infrared filter 23 may absorb all wavelengths shorter than the near infrared wavelengths. The infrared filter 23 will then absorb undesired radiation from sunlight and external illumination. By placing the infrared filter 23 in front of the lens 29 of the imaging system 15, the infrared filter 23 may also serve as a protective window or shielding plate.

The function of an infrared filter may be implemented anywhere in the imaging system 15. Thus, the infrared filter may alternatively be arranged in the housing 40 or be integrated in the prism 31 by the material of the prism 31 being highly absorptive to wavelengths shorter than the near infrared wavelengths. Alternatively or additionally, the infrared filter may be integrated in the lens, the mirror, the radiation sensor or the package (cf. 25 in FIG. 9).

Figure 12:
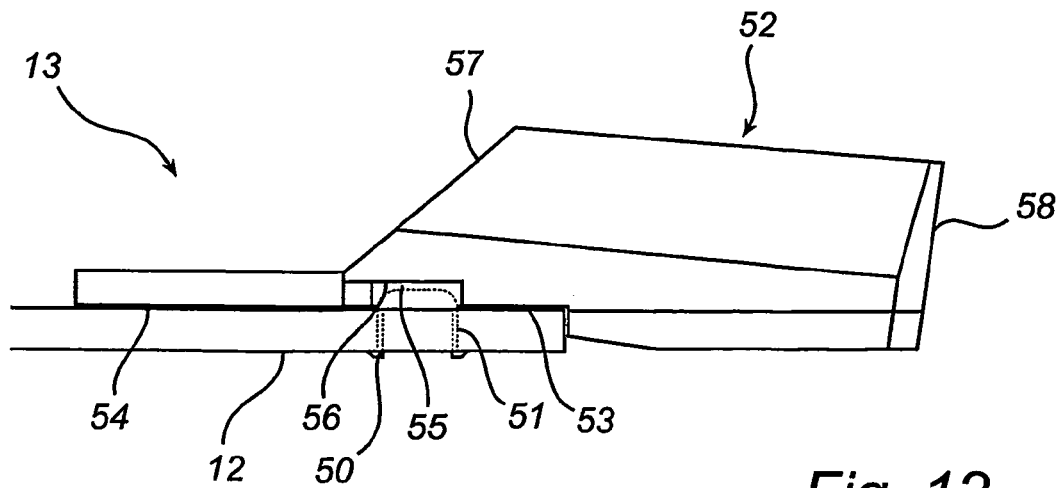
FIG. 12 is a side view of an embodiment of an irradiating system of the optical system.

FIG. 12 illustrates the irradiating system 13 of FIG. 8 in more detail. The irradiating system comprises a radiation source 50 which is arranged to emit radiation. The source 50 is typically a light-emitting diode (LED) or a laser diode that emits radiation in a limited wavelength band. The source 50 may be mounted in a through hole 51 in the PCB 12 and be electrically connected thereto. The irradiating system 13 further comprises a radiation guide 52 for directing the radiation to the desired area on the writing surface. The guide 52 may be formed in one piece of a plastic material, such as PMMA, polycarbonate, Zeonex®, polystyrene, nylon, or polysulfone.

The guide 52 is mounted to the PCB 12 over the through hole 51. The guide 52 comprises a base surface 53 which may be attached to the PCB 12 by e.g. gluing. The base surface 53 may comprise a flange 54 for providing a larger attachment area to the PCB 12, for example if needed to withstand a mechanical shock caused by the pen being dropped to the floor. The flange 54 is arranged merely for securing attachment of the guide 52 and not for transmitting radiation from the source 50. The guide 52 may further comprise guidance pins or holes (not shown) for controlling the positioning of the guide 52 in relation to the PCB 12 and/or the adjacent boresight unit 26 of the imaging system 15.

The guide 52 comprises a source receiving pocket 55, which is to be arranged over the through hole 51 in the PCB 12. The pocket 55 has a planar entrance surface 56 at its base and radiation from the source 50 enters the guide 52 through this entrance surface 56.

The guide 52 further has a mirror surface 57 which is arranged above the source receiving pocket 55 and inclined in relation to the base surface 53. The mirror surface 57 is metallized on the outside to provide a reflective surface. The radiation is redirected essentially 90° in the mirror surface 57, so that the optical axis of the irradiating system 13 in the optical path downstream of the mirror surface 57 is essentially parallel with the surface of the PCB 12. Thus, the PCB 12 will not obscure the irradiating of the writing surface by means of the irradiating system 13. The optical axis of the irradiating system 13 downstream of the mirror surface 57 may be somewhat inclined, typically by less than about 15°, and preferably by less than about 10°, to the longitudinal axis of the ink cartridge so that the irradiating system 13 will irradiate an area of the writing surface close to the pen point.

The guide 52 forms an essentially tubular shape for guiding the radiation after its reflection in the mirror surface 57. The radiation exits the guide 52 through an exit surface 58, which is provided at an end of the tubular shape. All surfaces except the entrance surface 56 and the exit surface 58 may be metallized, whereby radiation is controlled to exit only through the exit surface 58. Any internal radiation impinging on other walls will thus be reflected back into the guide 52.

The tubular shape of the guide 52 may have an essentially constant cross-section. The cross-section of the tubular shape may be designed to yield a desired shape of the irradiated area. Further, the longer the tubular shape is, the more uniform the emitted radiation of the guide 52 will be. However, it may be sufficient to keep the tubular shape so short that most of the emitted radiation will only have been reflected once before exiting the guide 52. The minimum width of the cross-section of the tubular shape in a direction parallel to the PCB surface is mainly determined by the size of the source receiving pocket 55. The cross-section of the tubular shape should be kept as small as possible to keep the radial size of the pen 1 down, while the emitted radiation should irradiate a sufficiently large area. To this end, the tubular shape of the guide 52 may be designed with an asymmetrical cross-section.

As illustrated in FIGS. 8 and 12, the exit surface 58 of the guide 52 is angled to the longitudinal axis of the tubular shape of the guide 52 so that the radiation is redirected in the exit surface 58 towards the writing surface to be irradiated. The redirection of radiation in the exit surface 58 implies that an optical axis of the irradiating system 13 beyond the guide 52 converges with the optical axis of the imaging system 15 towards the writing surface. The redirection of the optical axis of the irradiating system 13 in the exit surface 58 may be needed, since the optical axis of the irradiating system 13 in the tubular shape of the guide 52 is essentially parallel to the optical axis of the imaging system 15 in the tubular part 35 of the prism 31 or in the channel 41 of the housing 40. Typically, the angle between the optical axes of the imaging and irradiating systems is less than 15°.

The exit surface 58 of the guide 52 may be planar. Alternatively, the exit surface 58 may be curved to provide a surface power for controlling the size of the irradiated area.

Since the source 50 and the radiation sensor 24 are arranged close to each other on the PCB 12, there is a need for preventing leakage of radiation directly from the source 50 to the radiation sensor 24. Some features of the optical system 11 mentioned above serve to hinder such leakage. Thus, the guide 52 of the irradiating system 13 is metallized for preventing radiation to escape from other surfaces than the exit surface 58. Further, the prism 31 or the housing 40 may be painted or coated by a non-transmitting material to prevent radiation from entering the prism 31 or housing 40 through other surfaces than the entrance surface.

Since it is not uncommon for the radiation sensor 24 to be transparent from its backside, it may be important to ensure that radiation is not transmitted through the PCB 12 from the source 50 to the radiation sensor 24. To minimize any direct leakage of radiation from the source 50 into the PCB 12, the through hole 51 in the PCB 12 may be metallized. Further, one or more layers of copper may be arranged in the PCB 12 to reduce radiation propagation in the PCB. Further, non-transmitting glue may be used in attaching the prism 31 or the housing 41 to the PCB 12. Thereby, radiation is prevented from propagating in the interface between the prism 31 or the housing 40 and the PCB 12.

Moreover, where the shielding plate 23 (FIG. 4) is arranged in front of the imaging system, radiation emitted from the radiation guide 52 may, by reflection in the plate 23, be directed into the entrance surface of the imaging system 15. To avoid this, the imaging system 15 may be arranged to receive radiation that has passed through an area of the plate 23 that does not coincide with the area of the plate 23 that is irradiated by the irradiating system 13. Further, the plate 23 may be anti-reflection coated on one or both surfaces. Still further, the plate 23 may be angled such that reflections from the emitted radiation are deflected away from the imaging system 15.

In all of the above embodiments, the radiation source of the irradiating system may be mounted in any position directly on the carrier, on the PCB or on another component of the modular unit. However, the radiation source should preferably be kept in a close relationship to the imaging system, so as to minimize the effects of the pen orientation on the relationship between the imaged and irradiated areas on the writing surface.

In one embodiment, illustrated in FIGS. 13-19, the radiation source is mounted in a holder on an outer surface of the sensor boresight unit or imaging unit, which in turn is supported by the PCB. Thereby, a short tolerance chain and, consequently, a well-defined relationship is obtained between the irradiating system and the imaging system. Further, by attaching the radiation source to the boresight unit, the radiation source may be brought sufficiently close to the object plane of the imaging system for the radiation guide to be omitted. By dispensing with the radiation guide, the complexity and cost of the optical system may be reduced.

The embodiment of FIGS. 13-19 will now be described in some more detail, with emphasis being put on features, functions and advantages that differ from the previously described embodiments. In particular, it is to be noted that the above discussion on the irradiating system is not applicable to the embodiment described below.

The carrier 70 and the PCB 72 do not differ in essence from the embodiment described in relation to FIG. 4. Thus, the carrier 70 may comprise mounting compartments 74-77 for, i.a., a writing implement with a pen point (compartment 74), a contact sensor for the writing implement (compartment 75), a vibrator for user feedback, a battery for powering the processor and any further electronic components, a plurality of LEDs for user feedback (compartment 76), a transparent front plate for protecting the interior of the pen (compartment 77). The PCB 72 carries the radiation sensor 78, a processor 80 and further electronic equipment (not shown).

The optical system includes the boresight unit 82, the radiation sensor 78 and the irradiating system 84.

The boresight unit 82 contains an imaging lens 86, an aperture stop 88, and a redirecting mirror 90. The boresight unit 82 defines an object plane, an image plane, an optical axis, and a depth of field in the object plane. The boresight unit 82 is a unitary component which may be manufactured in one piece or assembled from separate elements. Thus, as an alternative to the embodiment illustrated in FIGS. 13-19, the boresight unit may be based on solid optics similarly to the boresight unit of FIG. 10. The following description is equally applicable to such an alternative embodiment.

The boresight unit is designed to be mounted on the PCB 72, with a given relation to the sensor 78 thereon. The PCB 72, in turn, is designed to be mounted on the carrier 70. A holder 92 is integrated with the boresight 82 unit to provide for mounting of the radiation source 94, in this case an LED, but alternatively a laser diode. Integrating the holder 92 in the boresight unit 82 may minimize the influence of assembly tolerances on the relative location of the field of view and the illuminated area on the writing surface. In an alternative embodiment (not shown), the holder is a separate part which is attached to the body of the boresight unit.

The source 94 is electrically connected to the PCB 72 via a pair of connecting pins 94' (truncated in FIGS. 13-19), to be supplied with power under the control of the processor 80. The pins 94' are guided by means of a pair of guiding tracks formed in the holder 92 and a downstream projection 95. The tracks in the projection 95 are curved to provide for forming of the pins 94'. During assembly, the pins 94' are arranged in the tracks and bent towards the PCB 72 before being fixed thereto, suitably by being soldered in corresponding receiving holes (not shown) in the PCB 72. It has been found that the fixation of the pins 94' to the PCB 72 produces desirable clamping forces between the boresight unit 82 and the PCB 72.

Figure 13:
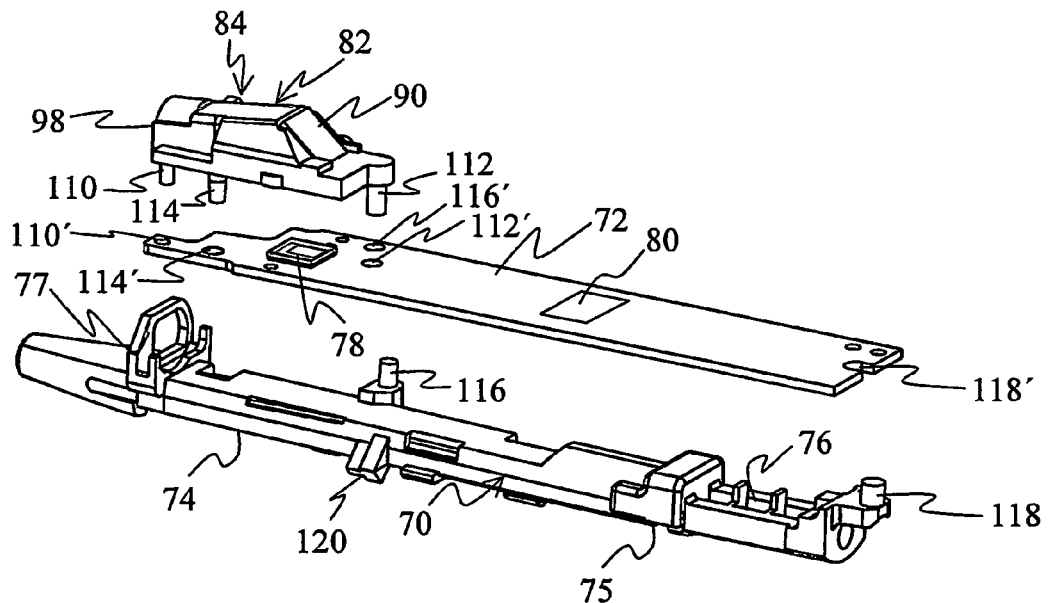
FIG. 13 is an exploded perspective view of another embodiment of a modular unit for an electronic pen.
Figures 14, 15:
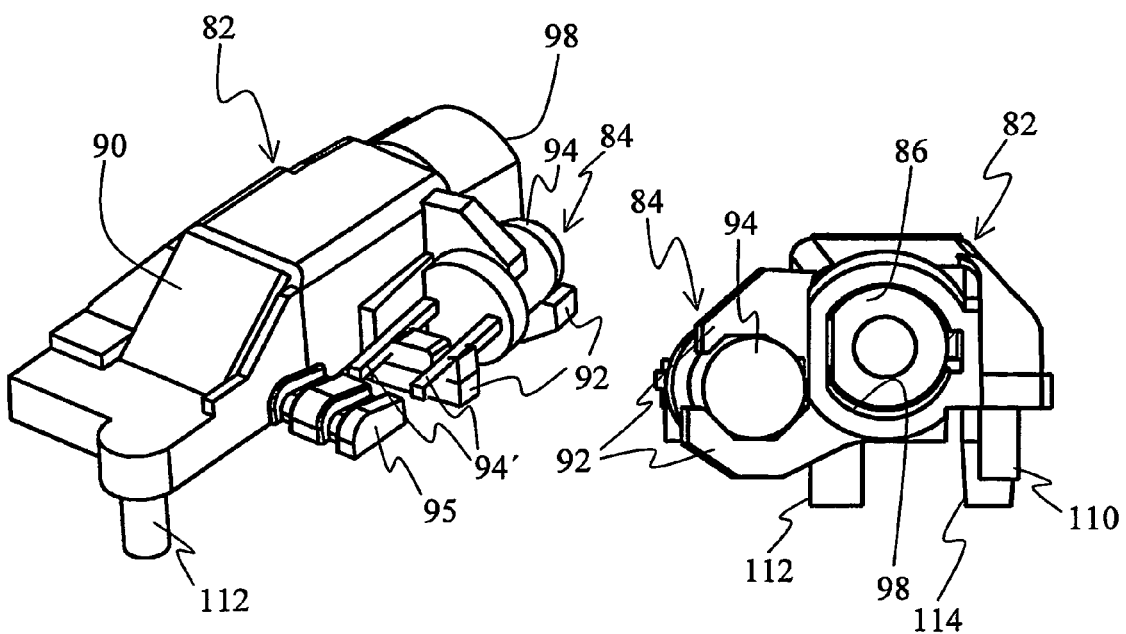
FIG. 14 is a perspective view of a component included in the modular unit of FIG. 13.
FIG. 15 is a front view of the component in FIG. 14.
Figure 16:
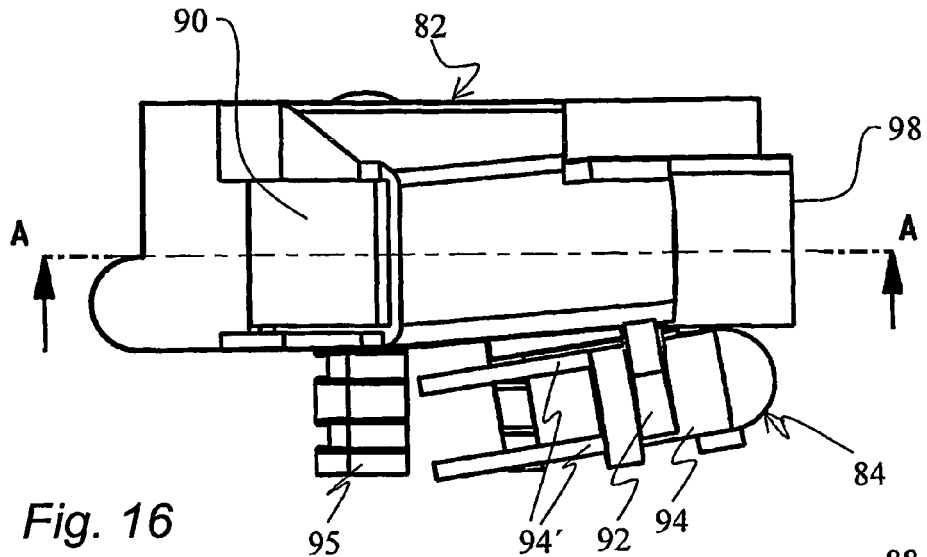
FIG. 16 is a top plan view of the component in FIG. 14.

The boresight unit 82 has a bottom surface with a radiation outlet 96, which is adapted to face the surface of the PCB 72 in suitable alignment with the sensor 78, and a proximate end with a radiation inlet 98 facing the shielding plate (cf. holder 77 in FIG. 13). The outlet 96 is dimensioned with clearance to the sensor 78. Thus, one and the same boresight unit may accommodate sensors/-packages of different type and/or geometry. In this embodiment, as well as in the other embodiments disclosed herein, the image plane defined by the boresight unit is located at, and in a predefined spatial relation to, the radiation sensor.

Figure 17:
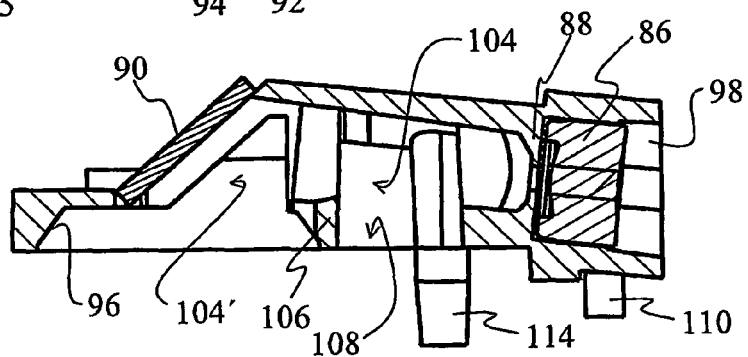
FIG. 17 is a sectional view taken along the line A-A in FIG. 16.
Figure 18:
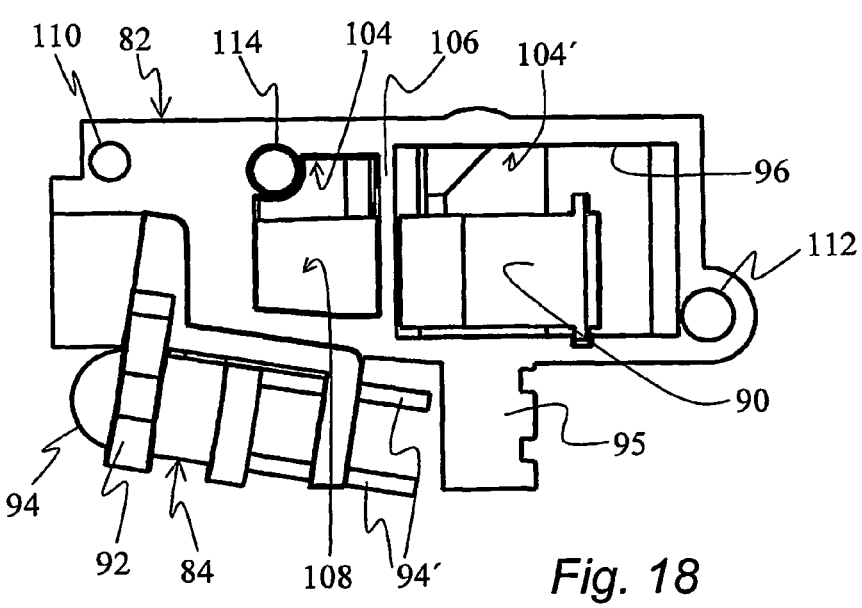
FIG. 18 is a bottom plan view of the component in FIG. 14.
Figure 19:
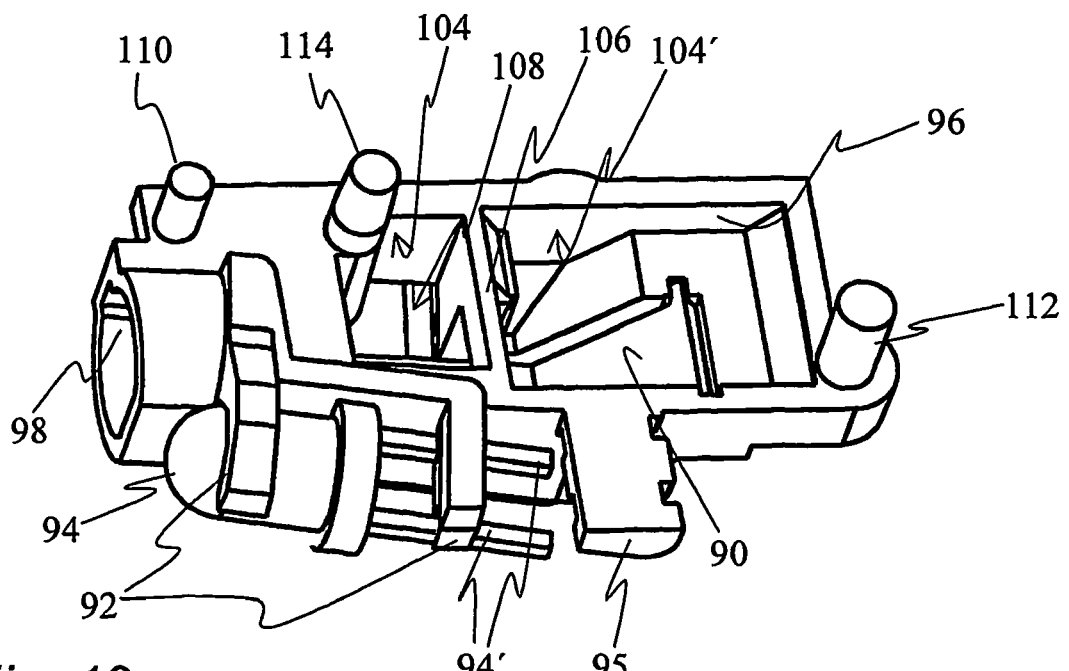
FIG. 19 is a bottom perspective view of the component in FIG. 14.

As shown in FIGS. 17-18, a radiation path is defined between the inlet 98 and the outlet 96 and is confined within the boresight unit 82. The imaging lens 86 is accommodated in a front pocket in abutment with the aperture stop 88. A channel is defined to extend from the aperture stop 88 to the outlet 96. The channel also connects to a radiation trap 104 which is defined in the side wall portion facing away from the holder 92. The trap is designed as a channel wall recess which collects and attenuates any impinging radiation. In particular, the trap 104 is positioned and designed for any source radiation that is reflected into the boresight unit by the shielding plate mounted in the holder 77 (FIG. 13). Further, a barrier wall 106 is formed upstream of the outlet 96, to block radiation from impinging on the sensor 78 without interacting with the mirror 90. To attenuate such blocked radiation, a bottom wall radiation trap 108 is formed upstream of the barrier wall 106. Also, a secondary radiation trap 104' is formed in the side wall downstream of the barrier wall 106. Although not shown on the drawings, further radiation traps may be formed in the top wall portion and/or in the side wall portion facing the holder. It has been found that radiation traps are particularly important for reduction of stray light within the boresight unit when it is desired to minimize the diameter of the internal channel.

The bottom surface has two projecting guiding pins 110, 112, which cooperate with corresponding guiding holes 110', 112' in the PCB 72 to define the placement of the boresight unit 82 on the PCB 72.

In the embodiment of FIGS. 13-18, the boresight unit 82 is fixed to the PCB 72 by deformation of a supplementary fixation pin 114 in a corresponding through hole 114' in the PCB 72. Alternatively or additionally, fixation may be achieved by deformation of one or both of the guiding pins 110, 112. Alternatively or additionally, use may be made of external clamping fixtures and/or welding, gluing, form fitting, press fitting, snap fitting, etc.

Further, the PCB 72 is fixed to the carrier 70 by deformation of supplementary fixation pins 116, 118 on the carrier 70 in corresponding through holes 116', 118' in the PCB 72. Alternatively or additionally, use may be made of external clamping fixtures and/or welding, gluing, form fitting, press fitting, snap fitting, etc.

Thus, an analysis system is formed by the combination of the boresight unit 82, the source 94 and the PCB 72 which carries the sensor 78 and the processor 80.

Likewise, a modular unit is formed by the combination of the analysis system and the carrier 70. The modular unit may be connected to one or more shell parts forming an outer casing of the pen, by means of one or more connectors 120 on the carrier 70, which may be designed to engage a corresponding connector on the shell part(s). Alternatively or additionally, use may be made of external fixtures, gluing, press fitting, etc.

The electronic pens as described herein may allow for determination of a position from an image of a position-coding pattern on the writing surface, the determination being carried out by the internal processor of the pen or by an external processor, e.g. as described in any one of US 2002/0044138, US 2002/0048404, US 2003/0053699, US 2003/0118233, US 2003/0122855, US 2003/0128194, U.S. Pat. Nos. 6,667,695, 6,674,427, 6,732,927, WO 04/097723, and references therein. The determination may also involve using the distance D (FIG. 2) to relate the position decoded from the imaged pattern to the actual writing position, i.e. the position of the contact point P (FIG. 2) on the writing surface. For instance, the processor can be arranged to calculate, based upon an image, the spatial orientation (e.g., inclination angle θ and skew angle Φ) of the pen and a position, and, knowing the position, the spatial orientation and the distance D, to calculate the writing position. However, deviations from the nominal value of the distance D may introduce systematic errors in the calculated writing position.

Figure 20:
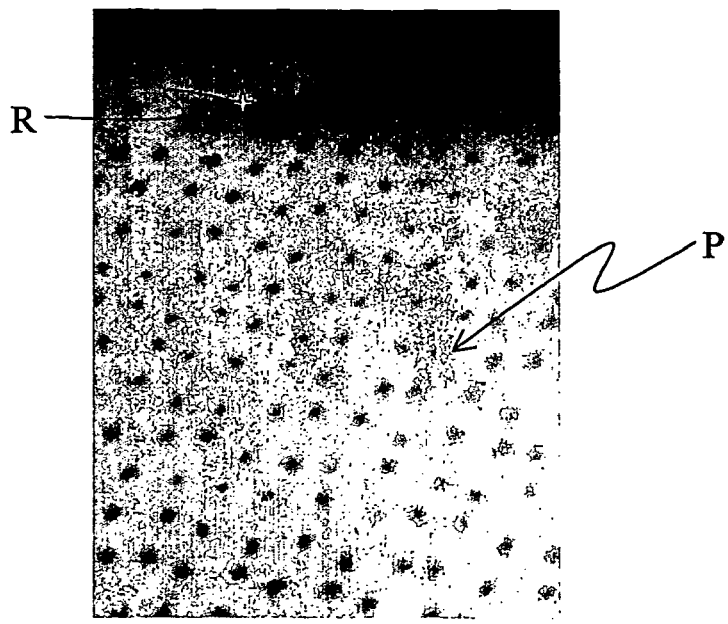
FIG. 20 is a sample image taken with an electronic pen according to the present invention.

To mitigate the effects of these deviations, the optical system/modular unit may be designed to image an area of the writing surface that is partly obscured by the ink cartridge. The tip of the ink cartridge may consist of a ball held by a cone leading up to the cylindrical body of the ink cartridge. The edge between the cone and the cylindrical body of the ink cartridge may then form an obscuration edge in the recorded images, although any other part of the tip may form such an obscuration edge. The obscuration edge may be nominally placed in the image such that the tolerance chain of components of the pen keeps the obscuration edge placed within the image. Thus, the obscuration edge may always be detectable in the images. Thereby, the position of the obscuration edge in the recorded images could be used for calibrating the distance D for individual pens. It should be noted that the distance D is a vector in the reference plane and the calibration is therefore made in two dimensions. FIG. 20 shows an example of such an image of a position-coding pattern P, in which the obscuration edge is visible (a reference point on the obscuration edge being indicated by R).

It should be emphasized that the embodiments described herein are in no way limiting and that many alternative embodiments are possible within the scope of protection defined by the appended claims.

For instance, the above writing implement can be, instead of an ink cartridge, a fountain pen unit, a pencil unit, a felt pen unit, a magnetic head for cooperation with a selectively magnetisable base, a heating head for cooperation with a heat sensitive base, an electronically controlled ink jet unit, a miniaturized laser printer unit etc. It may even be conceivable that the writing implement will not leave any trace of its path along the writing surface, and the writing that is detected by the imaging system and the image processor will not be visible to the eye. In this case, the writing implement may be e.g. a stylus or a pointed bar or rod.

Further, in the above description, a lens is described in several different occasions. In such cases, the lens may be implemented as a single optics component exhibiting a lens function or alternatively as a compound lens or a lens package.

Likewise, the above-mentioned printed circuit board (PCB) is intended to encompass other equivalent structures, such as thick film hybrids of metal or ceramic material, or wire wraps.

In an alternative embodiment, the boresight unit is supported by the PCB without being directly attached thereto. More specifically, the PCB with the radiation sensor rests on one side of the carrier, with at least one through hole in the PCB being aligned with a corresponding receiving bore in the carrier. The boresight unit, which has at least one protruding guiding pin, is fitted onto the PCB with the guiding pin passing the through hole and being fixed in the receiving bore of the carrier, to thereby adequately line up the boresight unit, the radiation sensor, and the carrier. As an alternative or addition, there may be provided at least one corresponding guiding pin on the carrier for cooperation with a receiving bore on the boresight unit, via a through hole in the PCB. Further, the base of the boresight unit may have at least one control surface for abutment on at least one corresponding control surface on the PCB and/or the radiation sensor. As mounted, the boresight unit may be pressed against the PCB, to thereby minimize any variations in the position of the boresight unit in the normal direction of the radiation sensor. The boresight unit may be fixed to the carrier by means of external clamping fixtures and/or by means of welding, gluing, form fitting, press fitting, snap fitting, etc, for example via the guiding pins.

In yet another alternative embodiment, the boresight unit is arranged to be supported directly by the carrier instead of by the PCB. Thus, the carrier comprises means for supporting the boresight unit, as well as means for supporting the PCB. These means may be implemented as cooperating pins and bores, form fits, snap fits, welding surfaces, gluing surfaces, etc.

The invention claimed is:

1. A modular unit for an electronic pen having a writing implement, said modular unit comprising:
   a carrier having a receiver for receiving the writing implement,
   a printed circuit board mounted on the carrier, the printed circuit board having at least one hole,
   a two-dimensional radiation sensor surface-mounted on the printed circuit board, the sensor positioned on the printed circuit board with respect to the least one hole,
   an imaging unit designed to control a spatial origin of radiation reaching the radiation sensor, the imaging unit defining an image plane and an object plane, the imaging unit having a body and a holder that is associated with an outer part of the body, the imaging unit further having at least one pin, and
   a radiation source for illuminating the object plane, the radiation source being held by the holder of the imaging unit,
   wherein the imaging unit is aligned with the printed circuit board such that the at least one pin of the imaging unit is inserted in the at least one hole of the printed circuit board to align the imaging unit to locate the image plane on the radiation sensor, and
   wherein the carrier, the printed circuit board, and the imaging unit are coupled together such that the printed circuit board is positioned between the carrier and the imaging unit.

2. The modular unit according to claim 1, further comprising an electrical connection between the radiation source and the printed circuit board.

3. The modular unit according to claim 2, wherein the electrical connection exerts a clamping force between the imaging unit and the printed circuit board.

4. The modular unit according to claim 1, wherein the printed circuit board is supported by the carrier.

5. The modular unit according to claim 1, wherein the printed circuit board is attached to the carrier.

6. The modular unit according to claim 1, wherein the imaging unit is supported by the printed circuit board.

7. The modular unit according to claim 1, wherein the imaging unit is attached to the printed circuit board.

8. The modular unit according to claim 1, further comprising at least one connector for attaching at least part of an outer casing of said electronic pen.

9. The modular unit according to claim 1, wherein the holder is integrated with the outer part of the body.

10. The modular unit according to claim 1, wherein the holder is attached to the outer part of the body.

11. The modular unit according to claim 1, wherein the carrier further includes a guide pin, the printed circuit board has a guide pin receiving hole, and
    wherein the printed circuit board is mounted on the carrier such that the guide pin is inserted into the guide pin receiving hole.

12. A modular unit for an electronic pen having a writing implement, said modular unit comprising:
    a carrier having a receiver for receiving the writing implement,
    a printed circuit board mounted on the carrier,
    a two-dimensional radiation sensor surface-mounted on the printed circuit board,
    an imaging unit designed to control a spatial origin of radiation reaching the radiation sensor, the imaging unit defining an image plane and an object plane, the imaging unit having a body and a holder that is associated with an outer part of the body, and a radiation source for illuminating the object plane, the radiation source being held by the holder of the imaging unit, wherein the carrier, the printed circuit board, and the imaging unit are coupled together such that the printed circuit board is positioned between the carrier and the imaging unit.

13. The modular unit according to claim 12, wherein:
the printed circuit board has at least one hole,
the sensor is positioned on the printed circuit board with respect to the least one hole,
the imaging unit has at least one pin, and
the imaging unit is aligned with the printed circuit board such that the at least one pin of the imaging unit is inserted in the at least one hole of the printed circuit board to align the imaging unit to locate the image plane on the radiation sensor.

14. The modular unit according to claim 12, wherein the carrier includes a guide pin, the printed circuit board has a guide pin receiving hole, and wherein the printed circuit board is mounted on the carrier such that the guide pin is inserted into the guide pin receiving hole.

15. The modular unit according to claim 12, further comprising an electrical connection between the radiation source and the printed circuit board.

16. The modular unit according to claim 15, wherein the electrical connection exerts a clamping force between the imaging unit and the printed circuit board.

17. The modular unit according to claim 12, wherein the printed circuit board is supported by the carrier.

18. The modular unit according to claim 12, wherein the printed circuit board is attached to the carrier.

19. The modular unit according to claim 12, wherein the imaging unit is supported by the printed circuit board.

20. The modular unit according to claim 12, wherein the imaging unit is attached to the printed circuit board.

21. The modular unit according to claim 12, further comprising at least one connector for attaching at least part of an outer casing of said electronic pen.

22. The modular unit according to claim 12, wherein the holder is integrated with the outer part of the body.

23. The modular unit according to claim 12, wherein the holder is attached to the outer part of the body.

24. A modular unit for an electronic pen having a writing implement, said modular unit comprising:

a carrier having a receiver for receiving the writing implement, a printed circuit board mounted on the carrier, the printed circuit board having at least one hole, a two-dimensional radiation sensor surface-mounted on the printed circuit board, the sensor positioned on the printed circuit board with respect to the least one hole, an imaging unit designed to control a spatial origin of radiation reaching the radiation sensor, the imaging unit defining an image plane and an object plane, the imaging unit having a body and a holder that is associated with an outer part of the body, the imaging unit further having at least one pin, and a radiation source for illuminating the object plane, the radiation source being held by the holder of the imaging unit, wherein the imaging unit is aligned with the printed circuit board such that the at least one pin of the imaging unit is inserted in the at least one hole of the printed circuit board to align the imaging unit to locate the image plane on the radiation sensor.

25. The modular unit according to claim 24, wherein the carrier, the printed circuit board, and the imaging unit are coupled together such that the printed circuit board is positioned between the carrier and the imaging unit.

26. The modular unit according to claim 24, wherein the carrier includes a guide pin, the printed circuit board has a guide pin receiving hole, and wherein the printed circuit board is mounted on the carrier such that the guide pin is inserted into the guide pin receiving hole.

27. The modular unit according to claim 24, further comprising an electrical connection between the radiation source and the printed circuit board.

28. The modular unit according to claim 27, wherein the electrical connection exerts a clamping force between the imaging unit and the printed circuit board.

29. The modular unit according to claim 24, wherein the printed circuit board is supported by the carrier.

30. The modular unit according to claim 24, wherein the printed circuit board is attached to the carrier.

31. The modular unit according to claim 24, wherein the imaging unit is supported by the printed circuit board.

32. The modular unit according to claim 24, wherein the imaging unit is attached to the printed circuit board.

33. The modular unit according to claim 24, further comprising at least one connector for attaching at least part of an outer casing of said electronic pen.

34. The modular unit according to claim 24, wherein the holder is integrated with the outer part of the body.

35. The modular unit according to claim 24, wherein the holder is attached to the outer part of the body.

* * * * *